(12) United States Patent
Lee et al.

(10) Patent No.: US 12,278,151 B2
(45) Date of Patent: Apr. 15, 2025

(54) SEMICONDUCTOR WAFER SEAL RING HAVING PROTRUSION EXTENDING INTO TRENCH IN SEMICONDUCTOR SUBSTRATE

(71) Applicant: Taiwan Semiconductor Manufacturing Company, Ltd., Hsinchu (TW)

(72) Inventors: Ming-Che Lee, Tainan (TW); Kuo-Ming Wu, Zhubei (TW); Sheng-Chau Chen, Tainan (TW); Hau-Yi Hsiao, Chiayi (TW); Guanyu Luo, Chiayi County (TW); Ping-Tzu Chen, Tainan (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 481 days.

(21) Appl. No.: 17/699,717

(22) Filed: Mar. 21, 2022

(65) Prior Publication Data
US 2023/0187294 A1 Jun. 15, 2023

Related U.S. Application Data

(60) Provisional application No. 63/288,751, filed on Dec. 13, 2021.

(51) Int. Cl.
*H01L 23/18* (2006.01)
*H01L 21/3105* (2006.01)
(Continued)

(52) U.S. Cl.
CPC ........ *H01L 23/18* (2013.01); *H01L 21/31051* (2013.01); *H01L 23/5226* (2013.01);
(Continued)

(58) Field of Classification Search
CPC .............. H01L 23/18; H01L 21/31051; H01L 23/5226; H01L 23/562; H01L 24/80; H01L 25/50
See application file for complete search history.

(56) References Cited

U.S. PATENT DOCUMENTS

| 10,062,748 B1 * | 8/2018 | Stamper ............... H01L 23/564 |
| 2005/0026397 A1 | 2/2005 | Daubenspeck et al. |

(Continued)

FOREIGN PATENT DOCUMENTS

| TW | 200625505 A | 7/2006 |
| WO | 2021152020 A1 | 8/2021 |

OTHER PUBLICATIONS

"HogoMax Series Water-soluble protective film for laser processing" The date of publication is unknown. Retrieved online on Mar. 21, 2022 from https://www.disco.co.jp/eg/products/related/hogomax.html.

*Primary Examiner* — Michael Jung
(74) *Attorney, Agent, or Firm* — Eschweiler & Potashnik, LLC

(57) ABSTRACT

The present disclosure relates to a semiconductor wafer structure including a semiconductor substrate and a plurality of semiconductor devices disposed along the semiconductor substrate. A dielectric stack including a plurality of dielectric layers is arranged over the semiconductor substrate. A conductive interconnect structure is within the dielectric stack. A seal ring layer is over the dielectric stack and laterally surrounds the dielectric stack along a first sidewall of the dielectric stack. The seal ring layer includes a first protrusion that extends into a first trench in the semiconductor substrate.

20 Claims, 29 Drawing Sheets

(51) Int. Cl.
  *H01L 23/00* (2006.01)
  *H01L 23/522* (2006.01)
  *H01L 25/00* (2006.01)
  *H01L 25/065* (2023.01)

(52) U.S. Cl.
  CPC ............ *H01L 23/562* (2013.01); *H01L 24/80* (2013.01); *H01L 25/50* (2013.01); *H01L 24/08* (2013.01); *H01L 25/0657* (2013.01); *H01L 2224/08146* (2013.01); *H01L 2224/80001* (2013.01); *H01L 2924/37001* (2013.01)

(56) References Cited

U.S. PATENT DOCUMENTS

| | | |
|---|---|---|
| 2008/0179710 A1 | 7/2008 | Yip et al. |
| 2008/0283969 A1 | 11/2008 | Jeng et al. |
| 2009/0289325 A1 | 11/2009 | Wang et al. |
| 2012/0074519 A1 | 3/2012 | Yeo et al. |
| 2015/0371957 A1* | 12/2015 | Wang ...................... H01L 21/78 257/620 |
| 2016/0336173 A1 | 11/2016 | Hagiwara |
| 2018/0122752 A1 | 5/2018 | Pagani et al. |
| 2019/0148130 A1 | 5/2019 | Chiang et al. |
| 2019/0279996 A1* | 9/2019 | Yamashita .......... H01L 27/0688 |

\* cited by examiner

SEMICONDUCTOR WAFER SEAL RING HAVING PROTRUSION EXTENDING INTO TRENCH IN SEMICONDUCTOR SUBSTRATE

REFERENCE TO RELATED APPLICATION

This application claims the benefit of U.S. Provisional Application No. 63/288,751, filed on Dec. 13, 2021, the contents of which are hereby incorporated by reference in their entirety.

BACKGROUND

Many modern electronic devices use integrated circuits that are formed on semiconductor wafers during semiconductor device fabrication processes. Increasingly, semiconductor wafers may be stacked and bonded together to form three-dimensional integrated circuits (3DICs). 3DICs have a number of advantages over traditional two-dimensional integrated circuits (2DICs), such as higher device density, greater speed, and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
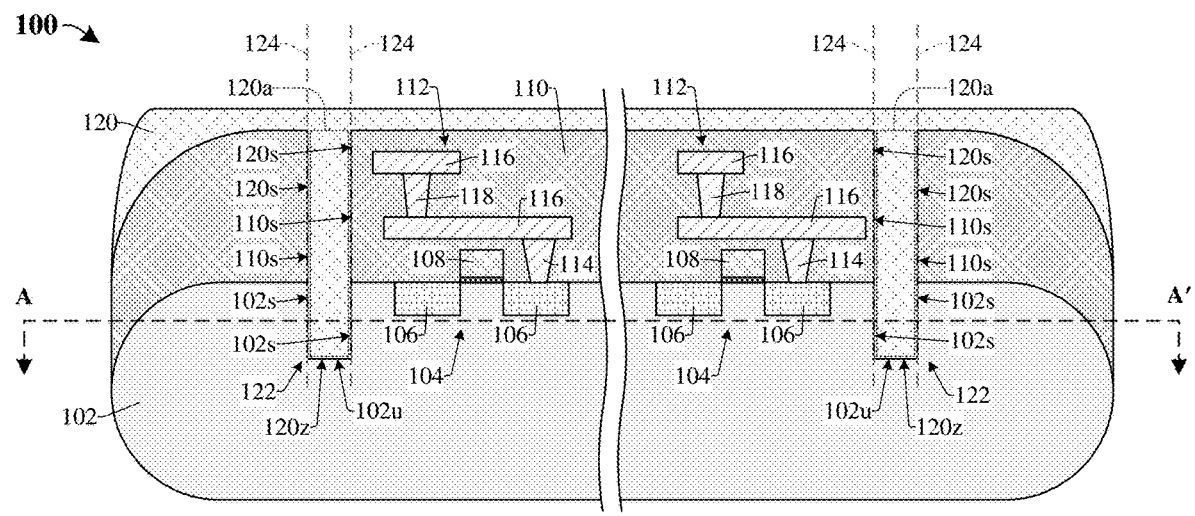
FIG. 1 illustrates a cross-sectional view of some embodiments of a semiconductor wafer structure comprising a dielectric stack over a substrate and a seal ring layer surrounding the dielectric stack.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, semiconductor devices (e.g., transistor devices) may be formed along a wafer substrate, a dielectric stack (e.g., including a plurality of dielectric layers) may be formed over the semiconductor devices, and a conductive interconnect structure (e.g., comprising a plurality of metal contacts, metal lines, metal vias, etc.) may be formed within the dielectric stack. In many modern day applications, semiconductor wafers may be bonded together along a bonding interface to form a bonded wafer structure. The wafers may then be trimmed along a perimeter of the bonded wafer structure. For example, a blade may be used to remove material from a periphery of the bonded wafer structure where incomplete bonding has occurred and/or will occur. The trimming cuts into the dielectric stacks of the bonded wafers along a perimeter of the bonded wafer structure. A trim wall resulting from the trimming is delimited by sidewalls of the dielectric stacks that are exposed by the trimming.

A challenge with some of these bonded wafer structures is that damage can occur along the dielectric stacks of the bonded wafers during trimming and/or during subsequent wafer processing (e.g., etching, planarization, or the like). For example, in some instances, a side of a blade used during trimming may rub against the sidewalls of the dielectric stacks that were exposed by the trimming (e.g., the trim wall). The rubbing may damage the sidewalls of the dielectric stacks. In some instances, the sidewalls of the dielectric stack may be damaged during one or more processes (e.g., etching, planarization, etc.) performed after trimming. For example, the dielectric stacks may experience cracking, peeling, or the like at the sidewalls. As a result, semiconductor die along the perimeter of the bonded wafer structure may be damaged and/or delaminated, and thus rendered unreliable. Thus, a yield of reliable die from the bonded wafer stack may be reduced.

Various embodiments of the present disclosure are related to a semiconductor wafer structure comprising a seal ring layer surrounding a sidewall of a dielectric stack to prevent damage from occurring along the sidewall of the dielectric stack during wafer trimming and/or during subsequent wafer processing. For example, the semiconductor wafer structure comprises a plurality of semiconductor devices disposed along the semiconductor substrate. The dielectric stack comprises a plurality of dielectric layers and is arranged over the semiconductor substrate. An interconnect structure comprising a plurality of conductive wires is disposed within the dielectric stack. The seal ring layer is arranged directly over the dielectric stack and laterally surrounds the dielectric stack along a sidewall of the dielectric stack. The seal ring layer includes a protrusion that extends below the dielectric stack and into a trench in the semiconductor substrate. The protrusion surrounds a center of the semiconductor substrate.

By including the seal ring layer in the semiconductor wafer structure, the dielectric stack may be protected from trim wall damage that may be caused by wafer trimming and/or by subsequent wafer processing (i.e., a likelihood of the dielectric stack suffering damage during a wafer trimming process may be reduced). For example, the seal ring layer comprises a dielectric that has a reduced susceptibility to damage. Thus, when trimming the semiconductor wafer structure along seal ring layer, the seal ring layer can protect the sidewall of the dielectric stack from suffering damage during trimming. The seal ring layer can also protect the sidewall of the dielectric stack from suffering damage during subsequent processing. As a result, semiconductor die along the perimeter of the semiconductor wafer structure may be protected from damage during trimming and/or subsequent processing. For example, the seal ring layer may prevent or reduce leakage path, shear force, trim peeling damage. Thus, a loss of reliability in the die along the perimeter may be reduced and hence a yield of reliable die from the semiconductor wafer structure may be improved.

Figure 2:
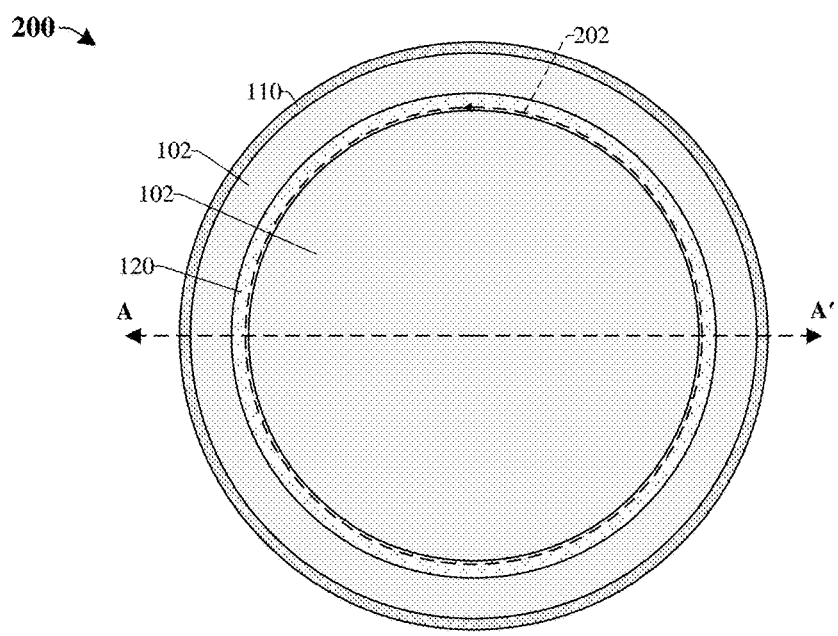
FIG. 2 illustrates a top view of some embodiments of the semiconductor wafer structure of FIG. 1.

FIG. 1 illustrates a cross-sectional view 100 of some embodiments of a semiconductor wafer structure comprising a dielectric stack 110 over a substrate 102 and a seal ring layer 120 surrounding the dielectric stack 110 along a sidewall 110s of the dielectric stack 110. FIG. 2 illustrates a top view 200 of some embodiments of the semiconductor wafer structure of FIG. 1. In some embodiments, the cross-sectional view 100 of FIG. 1 may be taken across line A-A' of FIG. 2.

Referring to FIG. 1, a plurality of semiconductor devices 104 are disposed along the substrate 102. In some embodiments, a semiconductor device 104 includes a pair of source/drains 106 in the substrate 102, a gate 108 over the substrate 102 and between the pair of source/drains 106, and a gate dielectric (not labeled) between the gate 108 and the substrate 102.

The dielectric stack 110 comprises a plurality of dielectric layers (e.g., 110a, 110b, 110c of FIG. 6) and is arranged directly over the substrate 102. A conductive interconnect structure 112 comprising a plurality of conductive features (e.g., contacts 114, conductive lines 116, conductive vias 118, etc.) is arranged within the dielectric stack 110. The interconnect structure 112 is coupled to the semiconductor devices at the contacts 114.

Referring to FIG. 1 and FIG. 2 simultaneously, a trench 122 is disposed in the dielectric stack 110 and in the substrate 102. The trench 122 is delimited by sidewalls 110s of the dielectric stack 110 and sidewalls 102s of the substrate 102. In some embodiments, the trench 122 is further delimited by an upper surface 102u of the substrate 102. The trench 122 surrounds a center of the substrate 102. For example, a sidewall 102s of the substrate 102 that delimits the trench 122 extends in a first closed path 202 along a perimeter of the substrate 102. The trench 122 also extends along the perimeter of the dielectric stack 110. In some embodiments, sidewalls 110s of the dielectric stack 110 and sidewalls 102s of the substrate 102 that delimit the trench 122 extend along common vertical axes 124 when viewed in cross-section.

The trench 122 extends below a topmost surface of the substrate 102 and below a bottommost surface of the dielectric stack 110. In some embodiments, the trench 122 extends below the semiconductor devices 104. For example, the semiconductor devices 104 extend into the substrate 102 to a first depth (not labeled) from a top surface of the substrate 102, the trench 122 extends into the substrate 102 to a second depth (not labeled) from the top surface of the substrate 102, and the second depth is greater than the first depth.

The seal ring layer 120 is disposed directly over the substrate 102 and directly over the dielectric stack 110. The seal ring layer 120 is or comprises a dielectric and forms a wafer-level seal ring.

The seal ring layer 120 comprises a protrusion 120a that is disposed in the trench 122 and that surrounds a center of the substrate 102. The protrusion 120a is directly over the trench 122, directly between the sidewalls 110s of the dielectric stack 110 that delimit the trench 122, and directly between sidewalls 102s of the substrate 102 that delimit the trench 122. Sidewalls 120s of the protrusion 120a extend along sidewalls 110s of the dielectric stack 110 that delimit the trench 122 and along the sidewalls 102s of the substrate 102 that delimit the trench 122. In some embodiments, a lower surface 120z of the protrusion 120a is on the upper surface 102u of the substrate 102 that delimits the trench 122. The protrusion 120a extends along the trench 122 in a ring shape. For example, the sidewalls 120s of the protrusion 120a extends in the first closed path 202. The protrusion 120a surrounds the dielectric stack 110 along a sidewall 110s of the dielectric stack 110. For example, a sidewall 120s of the protrusion 120a surrounds a perimeter of the dielectric stack 110 in a second closed path (not shown).

Because the seal ring layer 120 is included in the semiconductor wafer structure along the sidewall 110s of the dielectric stack 110, the dielectric stack 110 may be better protected from damage caused by wafer trimming and/or subsequent wafer processing. Thus, a likelihood of the dielectric stack 110 being damaged during a wafer trimming process and/or during subsequent wafer processing may be reduced. For example, the seal ring layer 120 comprises a dielectric that has a reduced susceptibility cracking, peeling, or other damage (e.g., damaged caused by wafer trimming and/or damage caused by subsequent wafer processing). Thus, when the semiconductor wafer structure is bonded to another wafer structure (see, for example, FIG. 24) and the bonded wafers are trimmed along seal ring layer 120 (see, for example, FIG. 26), the seal ring layer 120 can protect the dielectric stack 110 from damage during trimming. The seal ring layer 120 can also protect the dielectric stack 110 from damage during subsequent wafer processing (e.g., etching, planarization, etc.). As a result, semiconductor die along the perimeter of the bonded wafers may be protected during trimming and/or during subsequent processing. Thus, a yield of reliable die from the bonded wafers may be improved.

In some embodiments, the substrate 102 may, for example, comprise silicon, silicon germanium, or some other suitable semiconductor. In some embodiments, the semiconductor devices 104 may, for example, be or comprise metal-oxide-semiconductor field-effect transistors (MOSFETs), bipolar junction transistors (BJTs), junction field-effect transistors (JFETs), Fin field-effect transistors (Fin FETs), gate all-around field-effect transistors (GAA FETs), or some other suitable semiconductor devices. In some embodiments, the source/drains 106 may be or comprise doped regions of the substrate 102. In some embodiments, the gates 108 may comprise polysilicon, metal, some other conductive material, or some other suitable material.

In some embodiments, the dielectric layers of the dielectric stack 110 may, for example, comprise silicon dioxide, silicon nitride, some silicon-oxygen-carbon-hydrogen (SiOCH) dielectric, some other low-k dielectric, or some other suitable material. In some embodiments, the conductive features (e.g., contacts 114, conductive lines 116, conductive vias 118, etc.) of the interconnect structure 112 may, for example, comprise copper, aluminum, ruthenium, tungsten, cobalt, molybdenum, titanium, tantalum, an alloy of any of the foregoing, or some other suitable material.

In some embodiments, the seal ring layer 120 may, for example, be or comprise silicon dioxide, silicon nitride, hafnium oxide, or some other suitable material.

Figure 3:
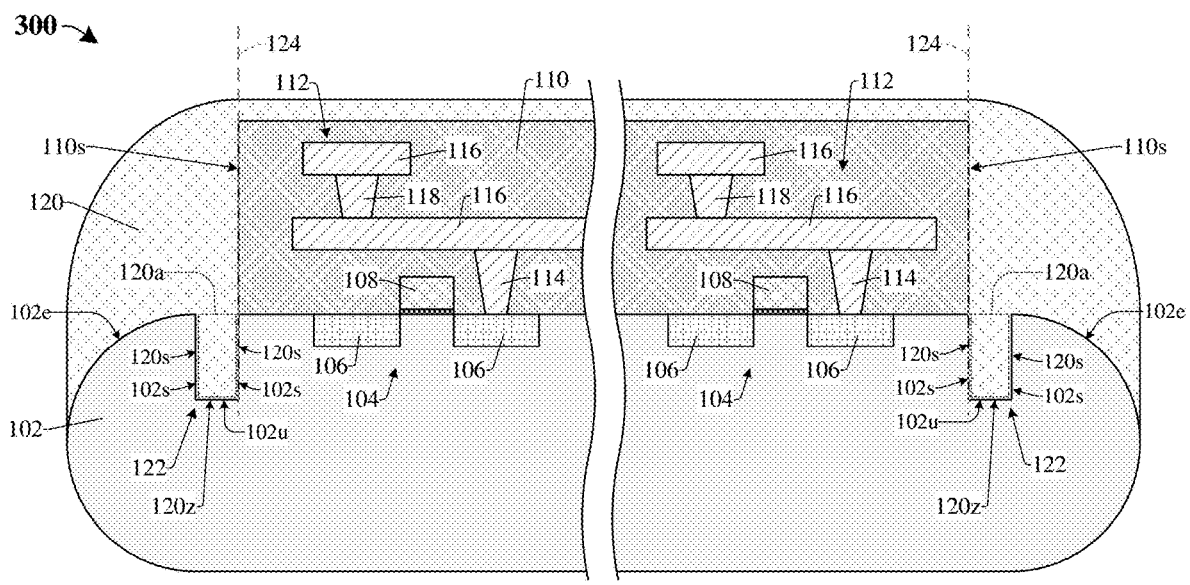
FIGS. 3-15 illustrate cross-sectional views of some other embodiments of the semiconductor wafer structure of FIG. 1.

FIG. 3 illustrates a cross-sectional view 300 of some embodiments of the semiconductor wafer structure of FIG. 1 in which the seal ring layer 120 is on the substrate 102 along an edge 102e of the substrate 102.

The dielectric stack 110 does not extend directly over the edge 102e of the substrate 102. The seal ring layer 120 surrounds the outermost sidewall 110s of the dielectric stack 110. The trench 122 is disposed in the substrate 102 and below the dielectric stack 110. In some embodiments, an inner sidewall of the substrate 102 that delimits the trench 122 and the outermost sidewall 110s of the dielectric stack 110 are aligned along a common vertical axis 124 when viewed in cross-section.

Figure 4:
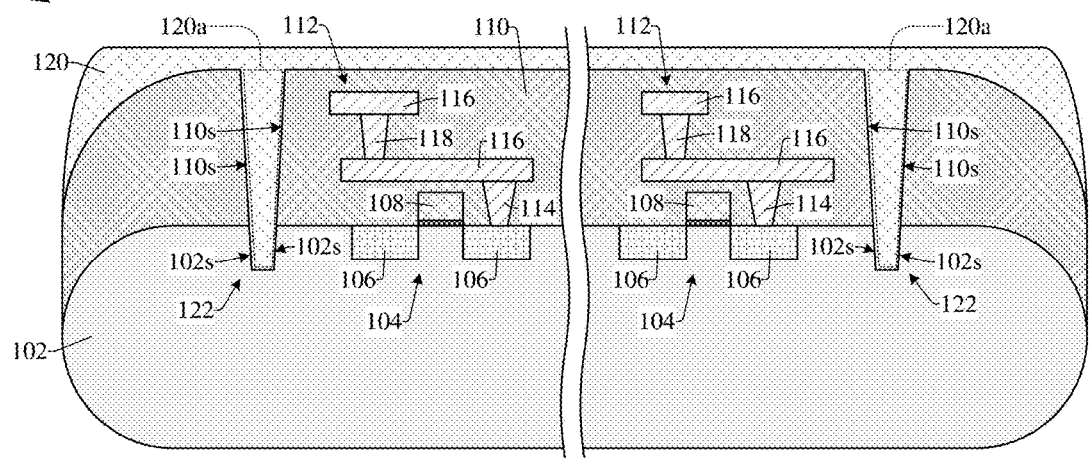
Figure 5:
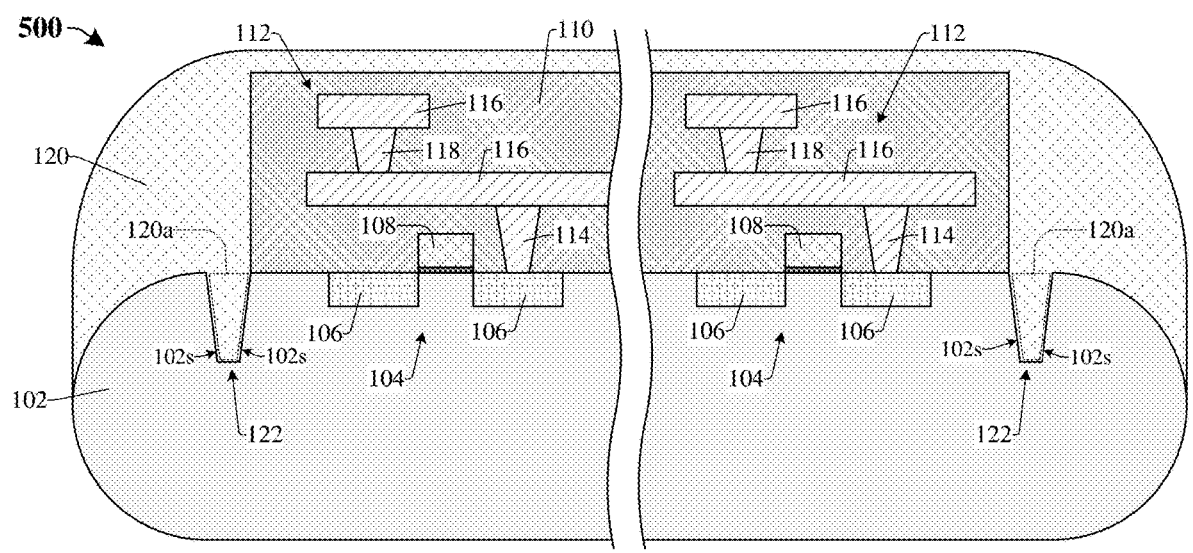

FIG. 4 illustrates a cross-sectional view 400 of some embodiments of the semiconductor wafer structure of FIG. 1 in which the trench 122 is tapered. FIG. 5 illustrates a cross-sectional view 500 of some embodiments of the semiconductor wafer structure of FIG. 3 in which the trench 122 is tapered.

Referring to FIG. 4, the sidewalls 110s of the dielectric stack 110 that delimit the trench 122 are slanted such that a distance between the sidewalls 110s along tops of the sidewalls 110s is greater than a distance between the sidewalls 110s along bottoms of the sidewalls 110s. Further, the seal ring layer 120 is directly over the sidewalls 110s of the dielectric stack 110 that delimit the trench 122.

Referring to FIGS. 4 and 5 simultaneously, the sidewalls 102s of the substrate 102 that delimit the trench 122 are slanted such that a distance between the sidewalls 102s along tops of the sidewalls 102s is greater than a distance between the sidewalls 102s along bottoms of the sidewalls 102s. Further, the seal ring layer 120 is directly over the sidewalls 102s of the substrate 102 that delimit the trench 122. The protrusion 120a of the seal ring layer 120 has slanted or tapered sidewalls accordingly.

Figure 6:
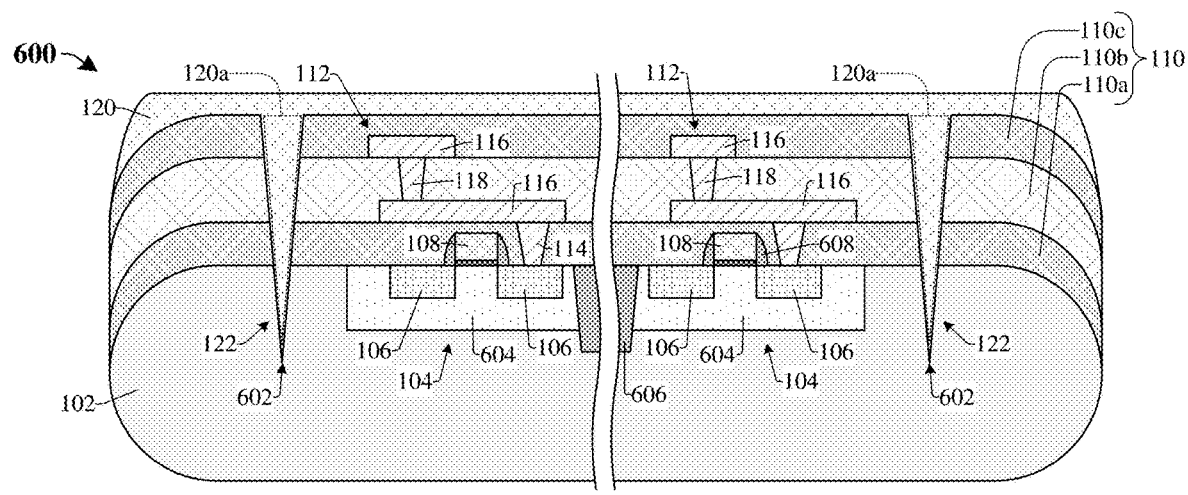
Figure 7:
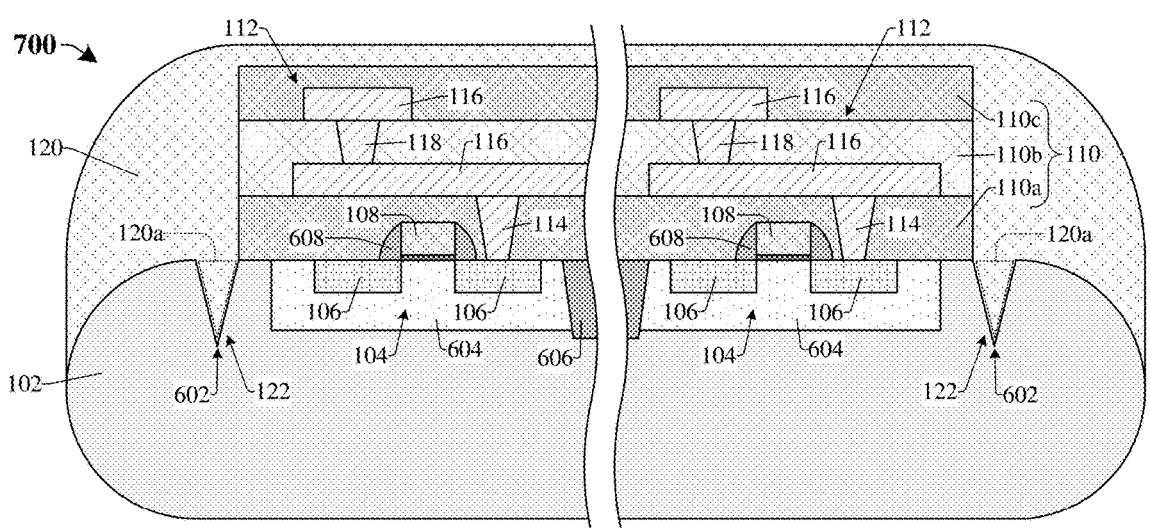

FIG. 6 illustrates a cross-sectional view 600 of some other embodiments of the semiconductor wafer structure of FIG. 1 in the trench 122 is tapered. FIG. 7 illustrates a cross-sectional view 700 of some other embodiments of the semiconductor wafer structure of FIG. 3 in the trench 122 is tapered.

Referring to FIG. 6 and FIG. 7 simultaneously, similarly to the trench 122 illustrated in FIG. 4 and the trench 122 illustrated in FIG. 5, the sidewalls of the substrate 102 that delimit the trench 122 are slanted. However, unlike the trenches 122 illustrated in FIGS. 4 and 5, the trenches 122 illustrated in FIGS. 6 and 7 are not delimited by an upper surface of the substrate 102. Instead, the sidewalls of the substrate 102 that delimit the trench 122 meet at an edge 602 that delimits the bottom of the trench 122. When viewed in cross-section, the edge 602 appears as a vertex. The protrusion 120a of the seal ring layer 120 has sidewalls that meet at an edge accordingly.

In some embodiments, the dielectric stack 110 includes, for example, a first dielectric layer 110a, a second dielectric layer 110b, and a third dielectric layer 110c. The first dielectric layer 110a is directly over the substrate 102. The second dielectric layer 110b is directly over the first dielectric layer 110a. The third dielectric layer 110c is directly over the second dielectric layer 110b. The interconnect structure 112 is disposed within each of the first dielectric layer 110a, the second dielectric layer 110b, and the third dielectric layer 110c.

In some embodiments, the different dielectric layers comprise different dielectric materials. For example, the first dielectric layer 110a may comprise a first dielectric material, the second dielectric layer 110b may comprise a second dielectric material, different from the first dielectric material, and the third dielectric layer 110c may comprise a third dielectric material, different from the first and second dielectric materials. In some other embodiments, the different dielectric layers comprise the same or similar dielectric materials.

The seal ring layer 120 extends along sidewalls of each of the first dielectric layer 110a, the second dielectric layer 110b, and the third dielectric layer 110c. The seal ring layer 120 further extends along a top surface of the third dielectric layer 110c and below a bottom surface of the first dielectric layer 110a.

Although the dielectric stack 110 is illustrated as having three dielectric layers in FIG. 3, it will be appreciated that the dielectric stack 110 may alternatively have some other number of dielectric layers (e.g., two dielectric layers, four dielectric layers, five dielectric layers, six dielectric layers, etc.).

In some embodiments, the semiconductor devices 104 further includes semiconductor wells 604. The semiconductor wells 604 are disposed in the substrate 102 and the source/drains 106 are disposed in the semiconductor well 604. The semiconductor wells 604 may be or comprise doped regions of the substrate 102. In some embodiments, shallow trench isolation (STI) structures 606 are disposed in the substrate 102 between semiconductor devices 104. In some embodiments, an STI structure 606 may separate one semiconductor well 604 from another semiconductor well 604. The STI structures 606 may comprise a dielectric or some other suitable material. In some embodiments, gate spacers 608 may be disposed on opposite sides of the gates 108 of the semiconductor devices 104. The gate spacers 608 may comprise a dielectric or some other suitable material.

Figure 8:
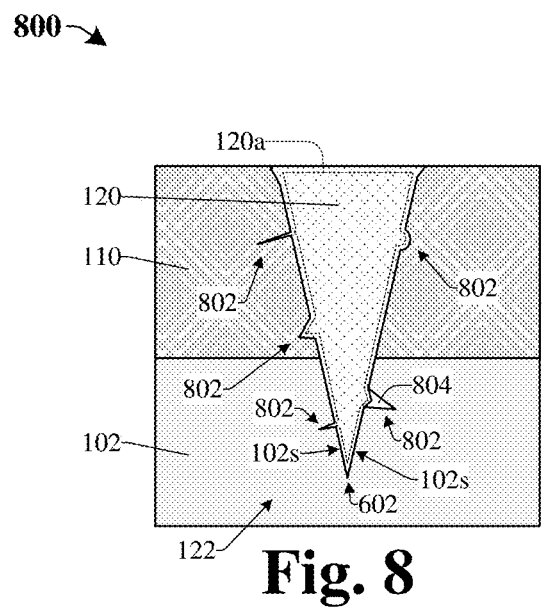
Figure 9:
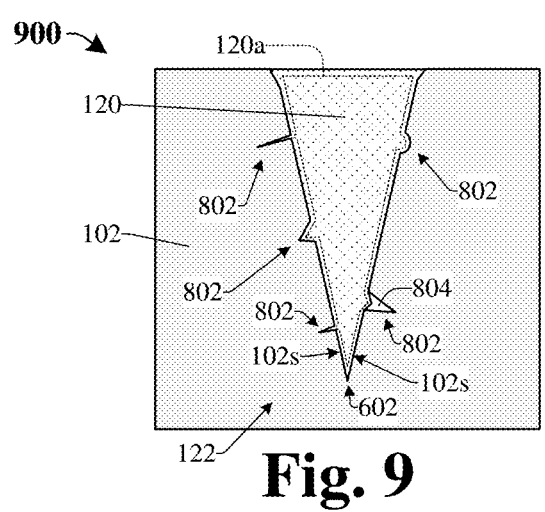

FIG. 8 illustrates a cross-sectional view 800 of some embodiments of the trench 122 of FIG. 6. FIG. 9 illustrates a cross-sectional view 900 of some embodiments of the trench 122 of FIG. 7.

Referring to FIG. 8, grooves 802 may exist in the dielectric stack 110 and further delimit the trench 122. For example, the grooves 802 exist along the sidewalls 110s of the dielectric stack 110 that delimit the trench 122. Some grooves 802 are formed by one or more surfaces of the dielectric stack 110.

Referring to FIGS. 8 and 9 simultaneously, grooves 802 exist in the substrate 102 and further delimit the trench 122. For example, the grooves 802 may exist along the sidewalls 102s of the substrate 102 that delimit the trench 122 and/or along the edge 602 where the sidewalls 102s of the substrate 102 meet. Some grooves 802 are formed by one or more surfaces of the substrate 102.

In some embodiments, each of the grooves 802 are filled by the seal ring layer 120. In some other embodiments, some grooves 802 are filled by the seal ring layer 120 while other grooves are not. For example, cavities 804 may exist at grooves 802 that are not filled by the seal ring layer 120. The cavities 804 may, for example, comprise air or the like.

Figure 10:
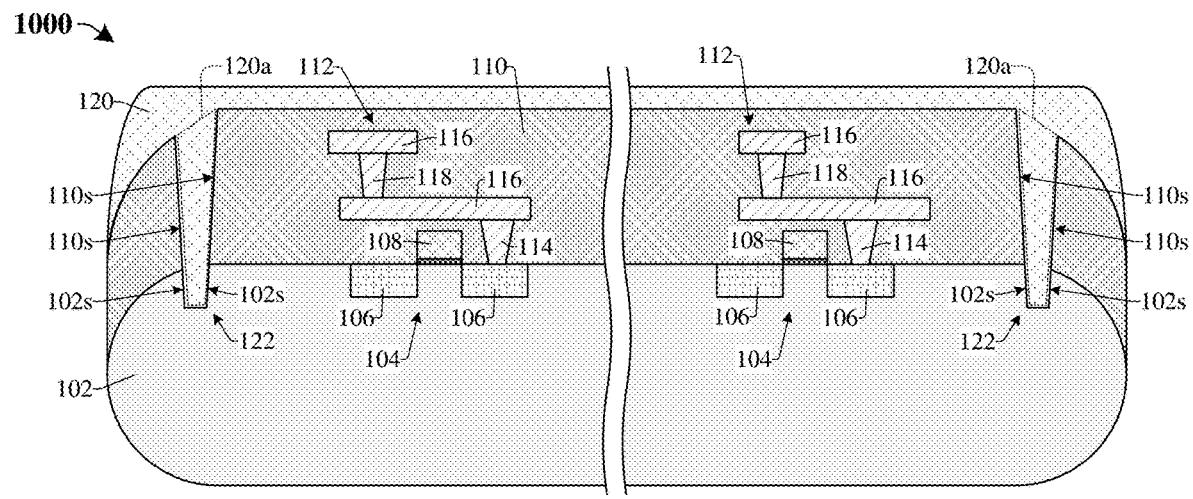
Figure 11:
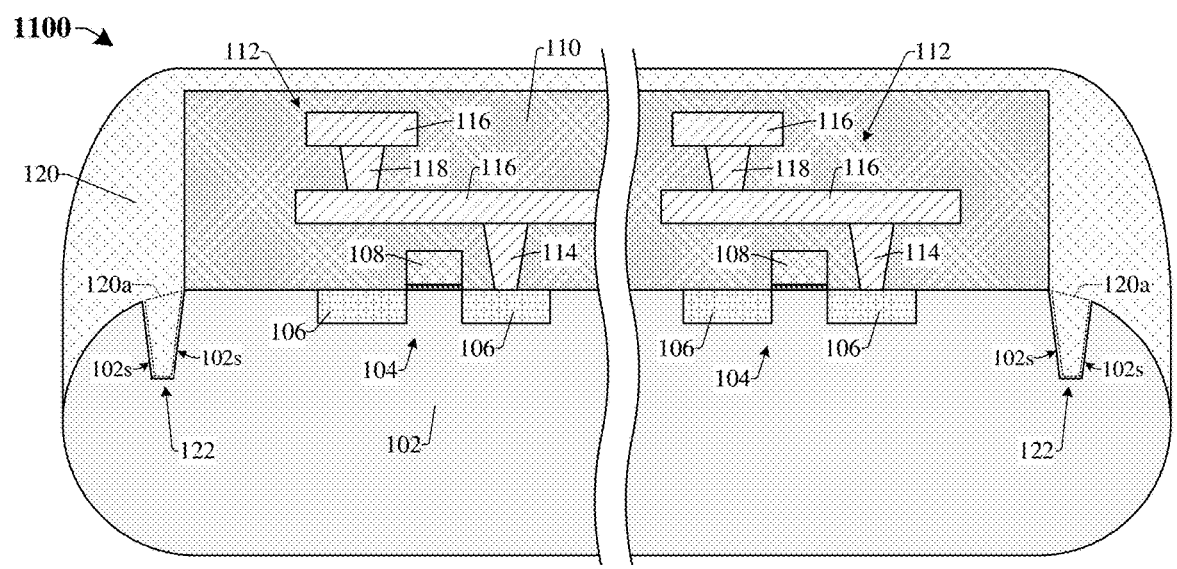

FIG. 10 illustrates a cross-sectional view 1000 of some embodiments of the semiconductor wafer structure of FIG. 4 in which the trench 122 is delimited by sidewalls of different heights. FIG. 11 illustrates a cross-sectional view 1100 of some embodiments of the semiconductor wafer structure of FIG. 5 in which the trench 122 is delimited by sidewalls of different heights.

Referring to FIG. 10, the outer sidewall of the dielectric stack 110 that delimits the trench 122 (e.g., the sidewall 110s which is closer to the outer edge of the substrate 102) has a lesser height than an inner sidewall of the dielectric stack 110 that delimits the trench 122 (e.g., the sidewall 110s which is closer to the center of the substrate 102). In other words, the inner sidewall of the dielectric stack 110 extends above a top of the outer sidewall of the dielectric stack 110.

Referring to FIG. 10 and FIG. 11 simultaneously, the outer sidewall of the substrate 102 that delimits the trench 122 (e.g., the sidewall 102s which is closer to the outer edge of the substrate 102) has a lesser height than an inner sidewall of the substrate 102 that delimits the trench 122 (e.g., the sidewall 102s which is closer to the center of the substrate 102). In other words, the inner sidewall of the substrate 102 extends above a top of the outer sidewall of the substrate 102.

Figure 12:
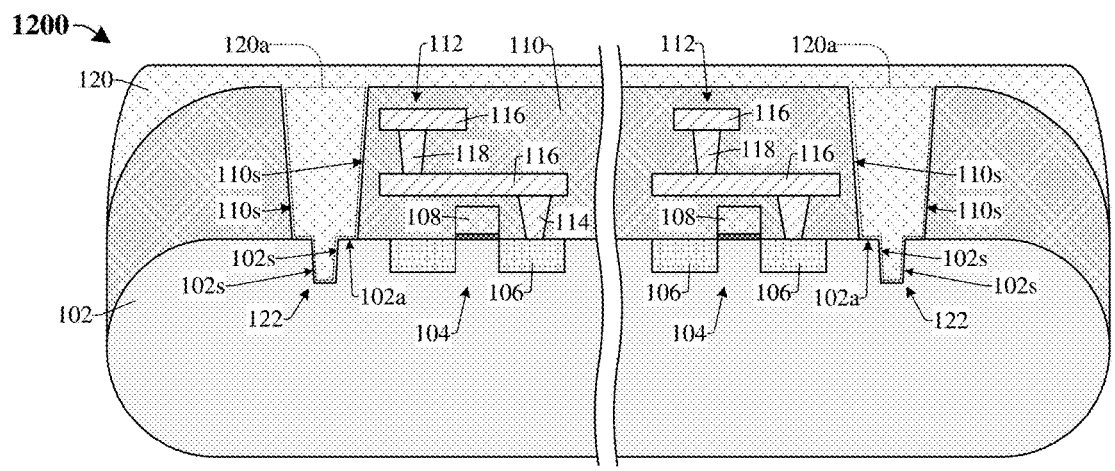
Figure 13:
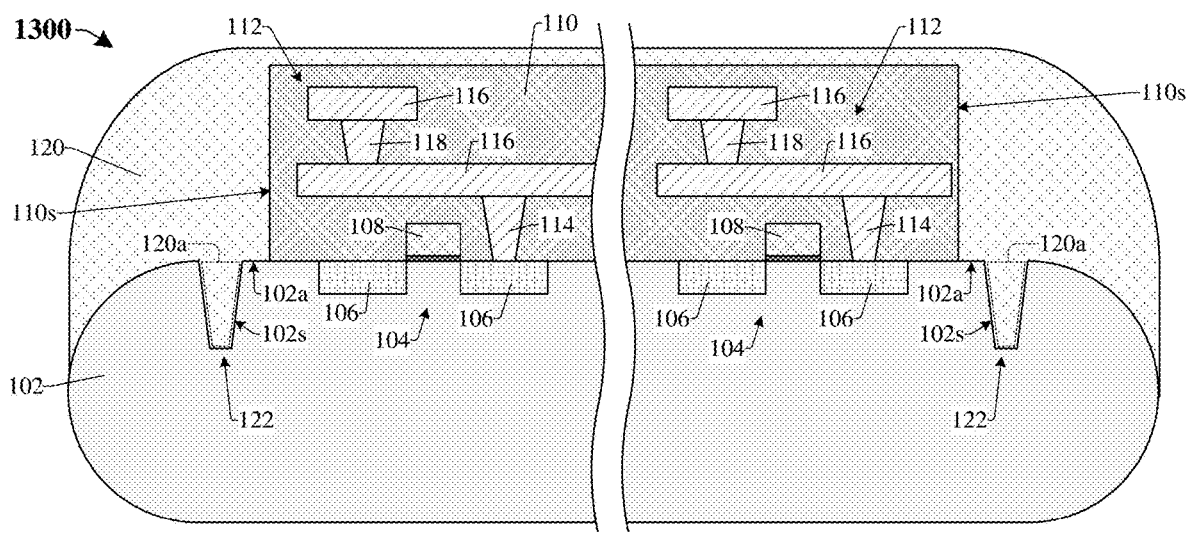

FIG. 12 illustrates a cross-sectional view 1200 of some embodiments of the semiconductor wafer structure of FIG. 4 in which the sidewalls 110s of the dielectric stack 110 that delimit the trench 122 are offset from the sidewalls 102s of the substrate 102 that delimit the trench 122. FIG. 13 illustrates a cross-sectional view 1300 of some embodiments of the semiconductor wafer structure of FIG. 5 in which the outer sidewall 110s of the dielectric stack 110 is offset from an inner sidewall 102s of the substrate 102 that delimits the trench 122.

Referring to FIG. 12, protrusion 120a of the seal ring layer 120 is on an upper surface 102a of the substrate 102 and directly between the sidewalls 110s of the dielectric stack 110. Thus, protrusion 120a has a step-shaped profile along a top of the trench 122 where the dielectric stack 110 abuts the substrate 102.

Referring to FIG. 13, the seal ring layer 120 is on an upper surface 102a of the substrate 102 and between an inner sidewall 102s of the substrate 102 that delimits the trench 122 and an outer sidewall 110s of the dielectric stack 110. Thus, the seal ring layer 120 in on the substrate 102 on opposite sides of the trench 122.

Figure 14:
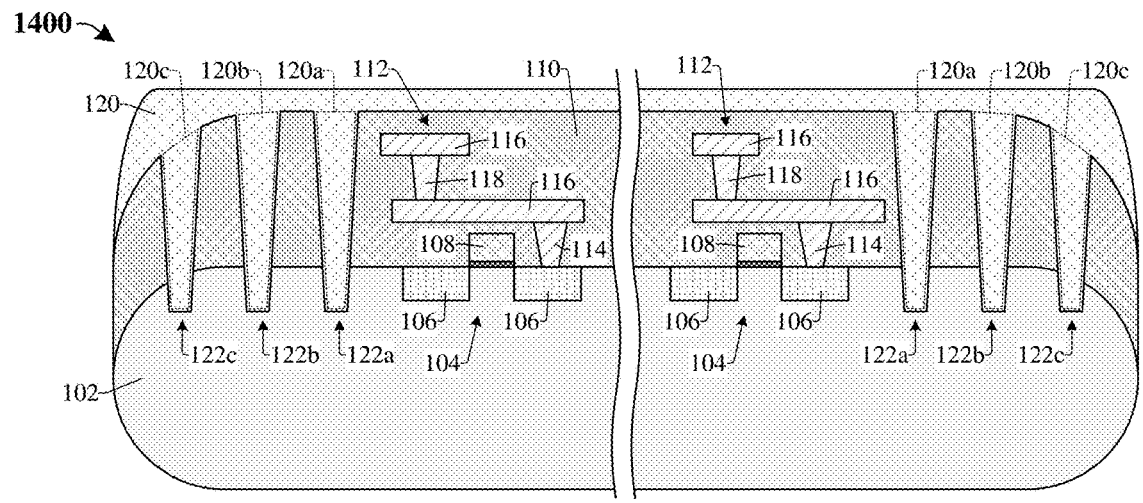
Figure 15:
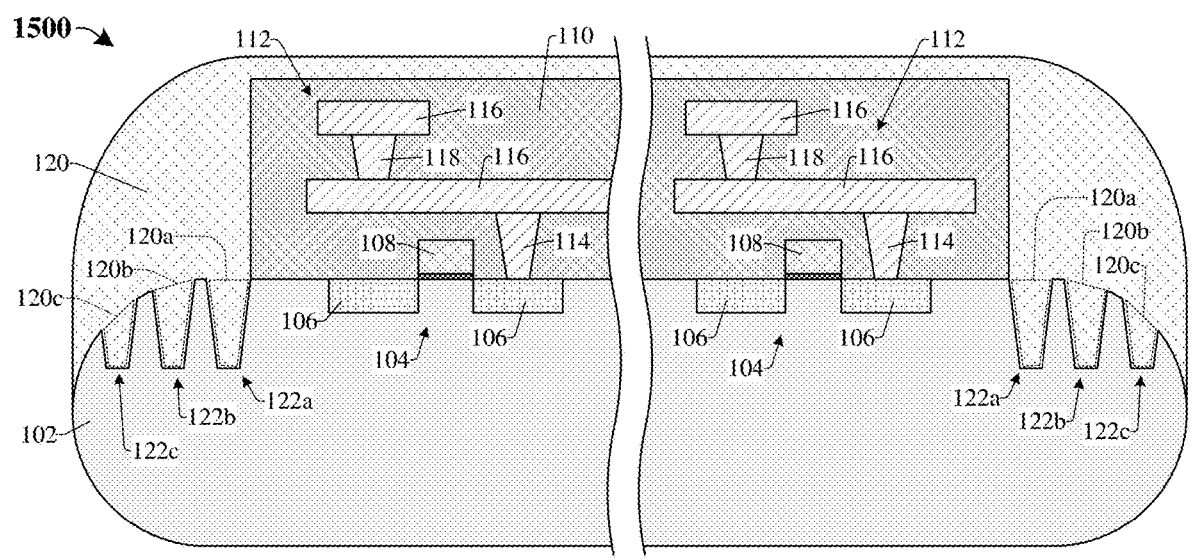

FIG. 14 illustrates a cross-sectional view 1400 of some embodiments of the semiconductor wafer structure of FIG. 4 in which a plurality of trenches are disposed in the substrate 102. FIG. 15 illustrates a cross-sectional view 1500 of some embodiments of the semiconductor wafer structure of FIG. 5 in which a plurality of trenches are disposed in the substrate 102.

Referring to FIG. 14, a first trench 122a, a second trench 122b, and a third trench 122c are disposed in the dielectric stack 110. A first protrusion 120a, a second protrusion 120b, and a third protrusion 120c of the seal ring layer 120 extend into and fill the first trench 122a, the second trench 122b, and the third trench 122c, respectively. The dielectric stack 110 is directly between the first protrusion 120a and the second protrusion 120b, and is also directly between the second protrusion 120b and the third protrusion 120c. The first trench 122a is delimited, in part, by a first pair of sidewalls (not labeled) of the dielectric stack 110. The second trench 122b is delimited, in part, by a second pair of sidewalls (not labeled) of the dielectric stack 110. The third trench 122c is delimited, in part, by a third pair of sidewalls (not labeled) of the dielectric stack 110.

Referring to FIG. 14 and FIG. 15 simultaneously, the first trench 122a is disposed in the substrate 102 and laterally surrounds a center of the substrate 102 in a first closed loop; the second trench 122b is disposed in the substrate 102 and laterally surrounds the first trench 122a in a second closed loop; and the third trench 122c is disposed in the substrate 102 and laterally surrounds the second trench 122b in a third closed loop. The first trench 122a is delimited by a first pair of sidewalls (not labeled) of the substrate 102. In some embodiments, the first trench 122a is further delimited by a first upper surface (not labeled) of the substrate 102. The second trench 122b is delimited by a second pair of sidewalls (not labeled) of the substrate 102. In some embodiments, the second trench 122b is further delimited by a second upper surface (not labeled) of the substrate 102. The third trench 122c is delimited by a third pair of sidewalls (not labeled) of the substrate 102. In some embodiments, the third trench 122c is further delimited by a third upper surface (not labeled) of the substrate 102.

Similar to FIG. 14, the first protrusion 120a, the second protrusion 120b, and the third protrusion 120c of the seal ring layer 120 extend into and fill the first trench 122a, the second trench 122b, and the third trench 122c, respectively. The substrate 102 is directly between the first protrusion 120a and the second protrusion 120b, and the substrate 102 is directly between the second protrusion 120b and the third protrusion 120c.

In some embodiments, including a plurality of trenches in the wafer structure may be beneficial in cases where the wafer structure will undergo multiple bonding processes (e.g., as illustrated in FIGS. 47-51). Although three trenches are illustrated in the semiconductor wafer structures of FIG. 14 and FIG. 15, it will be appreciated that in some other embodiments, the semiconductor wafer structures may include a different number of trenches (e.g., two trenches, four trenches, etc.).

FIGS. 16-26 illustrate cross-sectional views 1600-2600 of some embodiments of a method for forming a semiconductor wafer structure comprising a dielectric stack 110 over a substrate 102 and a seal ring layer 120 surrounding the dielectric stack 110. Although FIGS. 16-26 are described in relation to a method, it will be appreciated that the structures disclosed in FIGS. 16-26 are not limited to such a method, but instead may stand alone as structures independent of the method.

Figure 16:
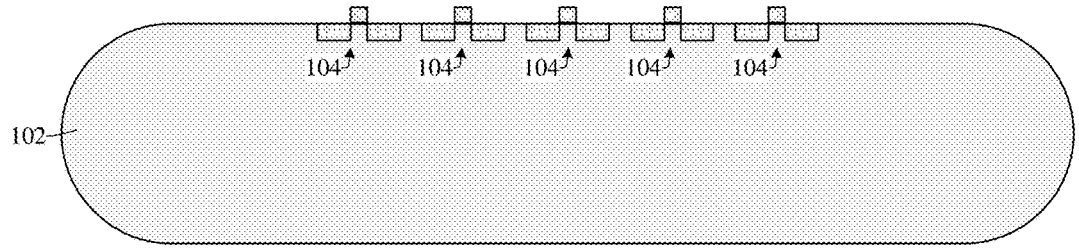
FIGS. 16-26 illustrate cross-sectional views of some embodiments of a method for forming a semiconductor wafer structure comprising a dielectric stack over a substrate and a seal ring layer surrounding the dielectric stack.

As shown in cross-sectional view 1600 of FIG. 16, a plurality of semiconductor devices 104 are formed along a semiconductor substrate 102. For example, the semiconductor devices 104 may be formed by doping regions of the substrate (e.g., via an ion implantation process or some other suitable process) to form source/drain regions along the substrate; depositing a dielectric layer over the substrate; depositing a gate layer (e.g., metal, polysilicon, or some other suitable material) over the dielectric; and patterning the gate layer and the dielectric layer to form gates and corresponding gate dielectrics from the gate layer and dielectric layer, respectively.

Figure 17:
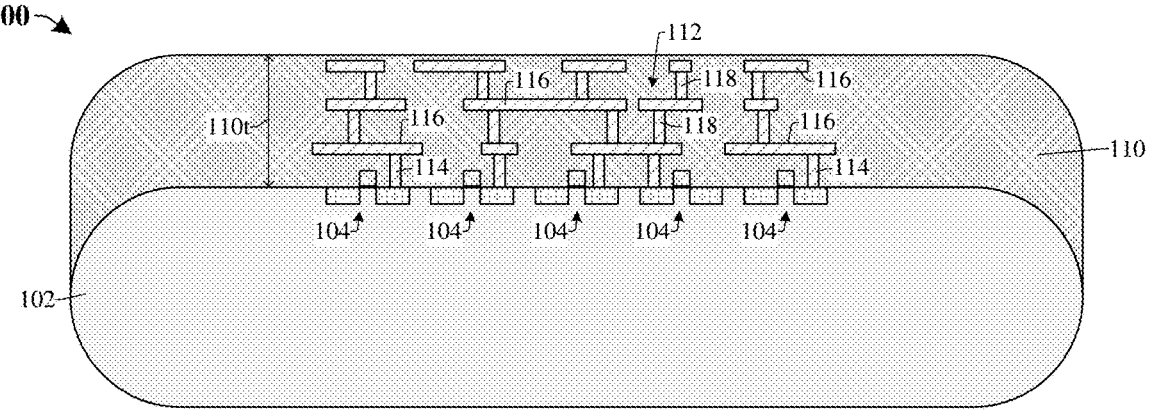

As shown in cross-sectional view 1700 of FIG. 17, a dielectric stack 110 and an interconnect structure 112 are formed over the substrate 102. For example, a first dielectric layer (e.g., 110*a* of FIG. 6) is deposited over the substrate 102 and a plurality of contacts 114 are formed within the first dielectric layer; a second dielectric layer (e.g., 110*b* of FIG. 6) is deposited over the first dielectric layer and a plurality of conductive lines 116 and/or conductive vias 118 are formed within the second dielectric layer 110*b*; and a third dielectric layer (e.g., 110*c* of FIG. 6) is deposited over the second dielectric layer and a plurality of conductive lines 116 and/or conductive vias 118 are formed within the third dielectric layer.

In some embodiments, the dielectric layers may comprise silicon dioxide, silicon nitride, some silicon-oxygen-carbon-hydrogen (SiOCH) dielectric, some other low-k dielectric, or some other suitable material and may be deposited by a chemical vapor deposition (CVD) process, a physical vapor deposition (PVD) process, an atomic layer deposition (ALD) process, or some other suitable process. In some embodiments, the conductive features may comprise copper, tungsten, aluminum, or some other suitable material. In some embodiments, the conductive features may be formed by etching the dielectric layers, depositing a conductive material over the etched dielectric layers, and planarizing the deposited conductive material. In some embodiments, a thickness 110*t* of the dielectric stack 110 may be in a range of about 3 micrometers to 10 micrometers or some other suitable range.

In some embodiments, a plurality of die-level seal rings (e.g., 3902 of FIG. 39) are formed within the dielectric stack 110. The die-level seal rings may comprise conductive features or some other suitable materials.

Figure 18:
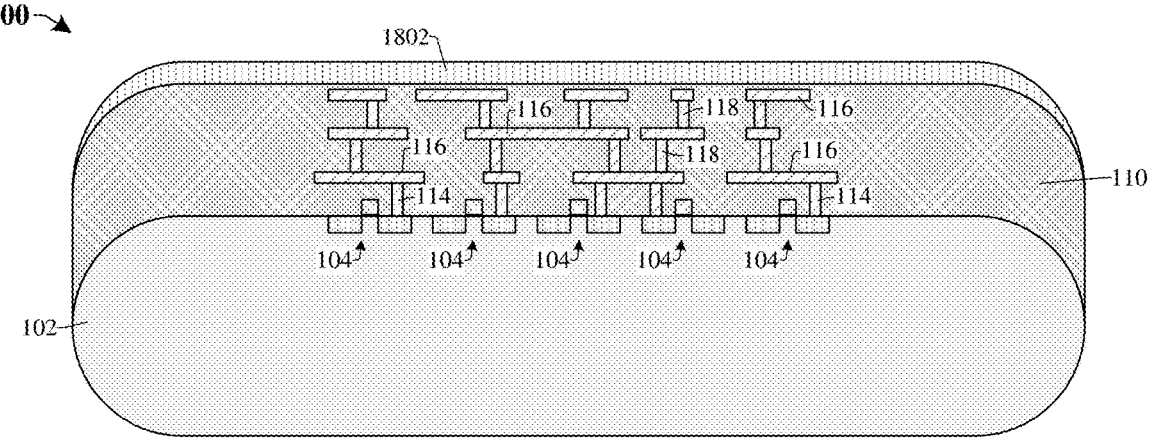

As shown in cross-sectional view 1800 of FIG. 18, a protective layer 1802 is deposited over the dielectric stack 110. The protective layer 1802 covers the semiconductor devices 104 and the top surface of the substrate 102. In some embodiments, the protective layer 1802 comprises a water-soluble resin or some other suitable material and is deposited by a spin coating process or some other suitable process. The water-soluble resin may prevent or reduce particles from adhering to the wafer surface.

Figure 19:
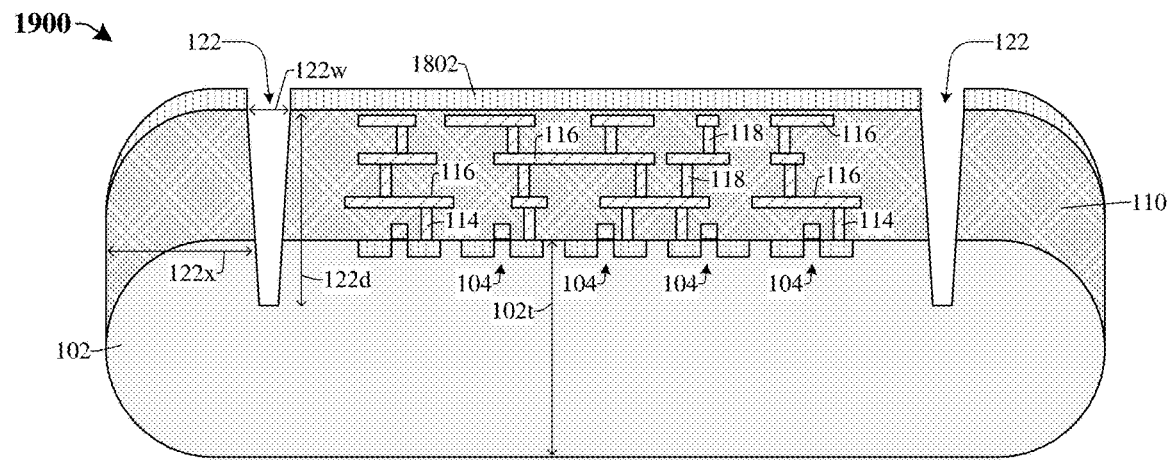

As shown in the cross-sectional view 1900 of FIG. 19, a trench 122 is formed in the dielectric stack 110 and in the substrate 102. In some embodiments, the trench 122 is formed by cutting into the dielectric stack 110 and the substrate 102 using a laser beam. For example, the laser beam cuts through the protective layer 1802, through the dielectric stack 110, and into the substrate 102. The protective layer 1802 protects the uncut regions of the dielectric stack 110 from debris during the laser cutting process. The protective layer 1802 may be removed from over the dielectric stack 110 after the trench 122 is formed. In some embodiments, the protective layer 1802 may be removed by a chemical cleaning process, a deionized-water cleaning process, or some other suitable process. In some other embodiments, the trench 122 may be formed by other processes as, for example, etching or the like.

In some embodiments, a thickness 102*t* of the substrate 102 is in the range of about 700 micrometers to 750 micrometers, in the range of about 750 micrometers to 775 micrometers. or some other suitable range. In some embodiments, a depth 122*d* of the trench 122 is in the range of about 10 micrometers to 50 micrometers or some other suitable range. In some embodiments, a width 122*w* of the trench 122 is in the range of about 5 micrometers to 20 micrometers or some other suitable range. In some embodiments, a distance 122*x* between the trench 122 and the outermost edge of the substrate 102 is in the range of about 130 micrometers to 160 micrometers, 140 to 150 micrometers, 147 to 149.5 micrometers, 147 to 150 micrometers, or some other suitable range.

Figure 20:
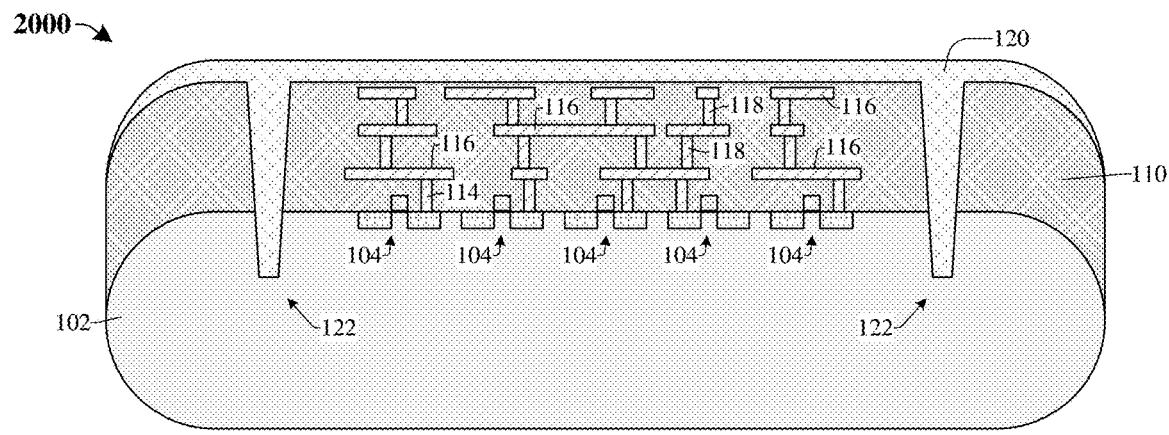

As shown in cross-sectional view 2000 of FIG. 20, a seal ring layer 120 is deposited (e.g., with a first deposition process) over the substrate 102, over the dielectric stack 110, and in the trench 122. The seal ring layer 120 comprises a dielectric material that has a reduced susceptibility to damage (e.g., during trimming or subsequent wafer processing). For example, in some embodiments, the seal ring layer 120 comprises silicon dioxide, silicon nitride, hafnium oxide, or some other suitable material and may be deposited by a CVD process, a PVD process, an ALD process, or some other suitable process.

Figure 21:
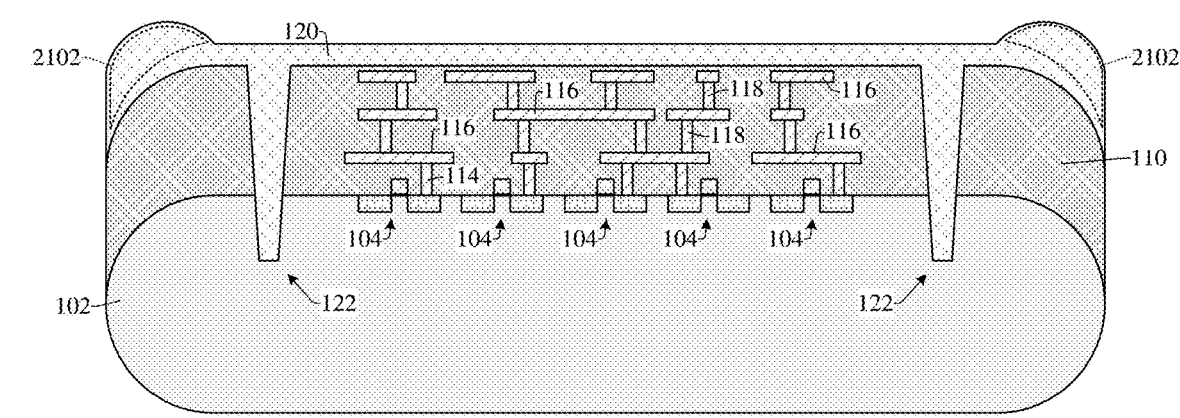

As shown in cross-sectional view 2100 of FIG. 21, in some embodiments, additional seal ring layer material is deposited (e.g., with a second deposition process) over the existing seal ring layer 120 along an edge of the substrate 102 (e.g., between a trench 122 and the edge of the substrate 102) to form a seal ring cap 2102 over the edge of the substrate 102.

Figure 22:
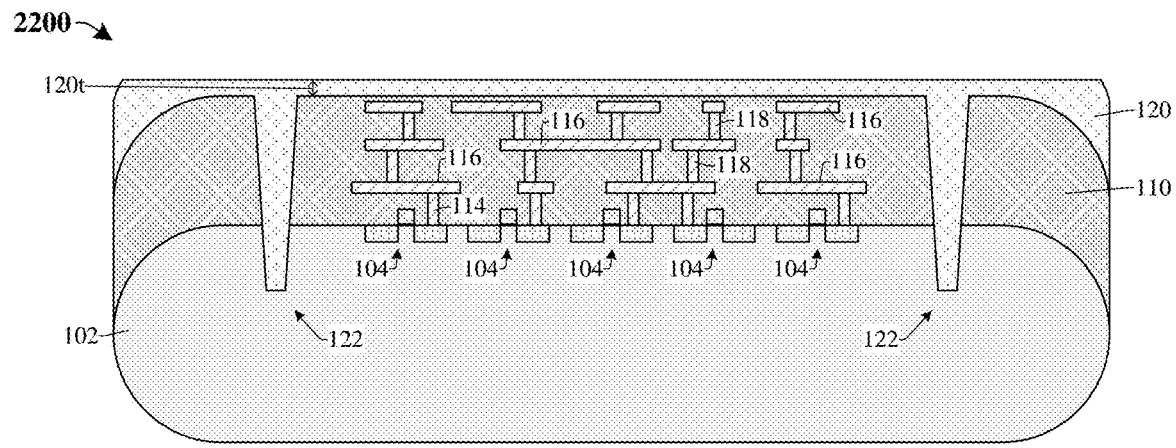

As shown in cross-sectional view 2200 of FIG. 22, a planarization process is performed on the seal ring layer 120 to planarize a top surface of the seal ring layer 120. In some embodiments, the planarization process is or comprises a chemical mechanical planarization (CMP) process or some other suitable process. In some embodiments, a thickness 120*t* the portion of the seal ring layer 120 that is directly over the dielectric stack 110 is greater than about 0.1 micrometers or some other suitable thickness after the planarization process is performed.

Figure 23:
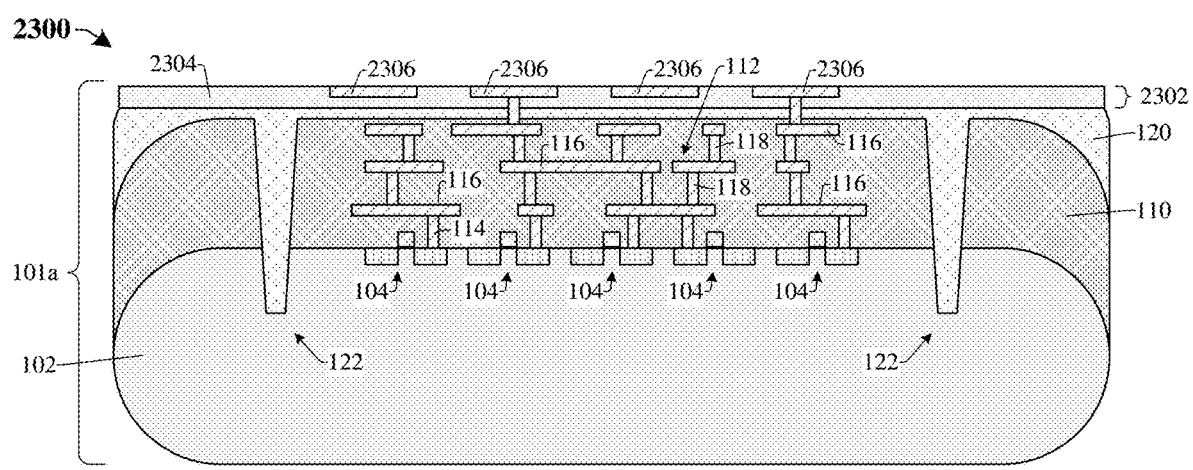

As shown in cross-sectional view 2300 of FIG. 23, a redistribution structure 2302 is formed over the seal ring layer 120. The redistribution structure 2302 comprises one or more redistribution dielectric layer(s) 2304 and one or more redistribution conductive wire(s) 2306 in the redistribution dielectric layer(s) 2304. The substrate 102, the semiconductor devices 104, the dielectric stack 110, the interconnect structure 112, the seal ring layer 120, and the redistribution structure 2302 together establish a first wafer structure 101*a*.

Figure 24:
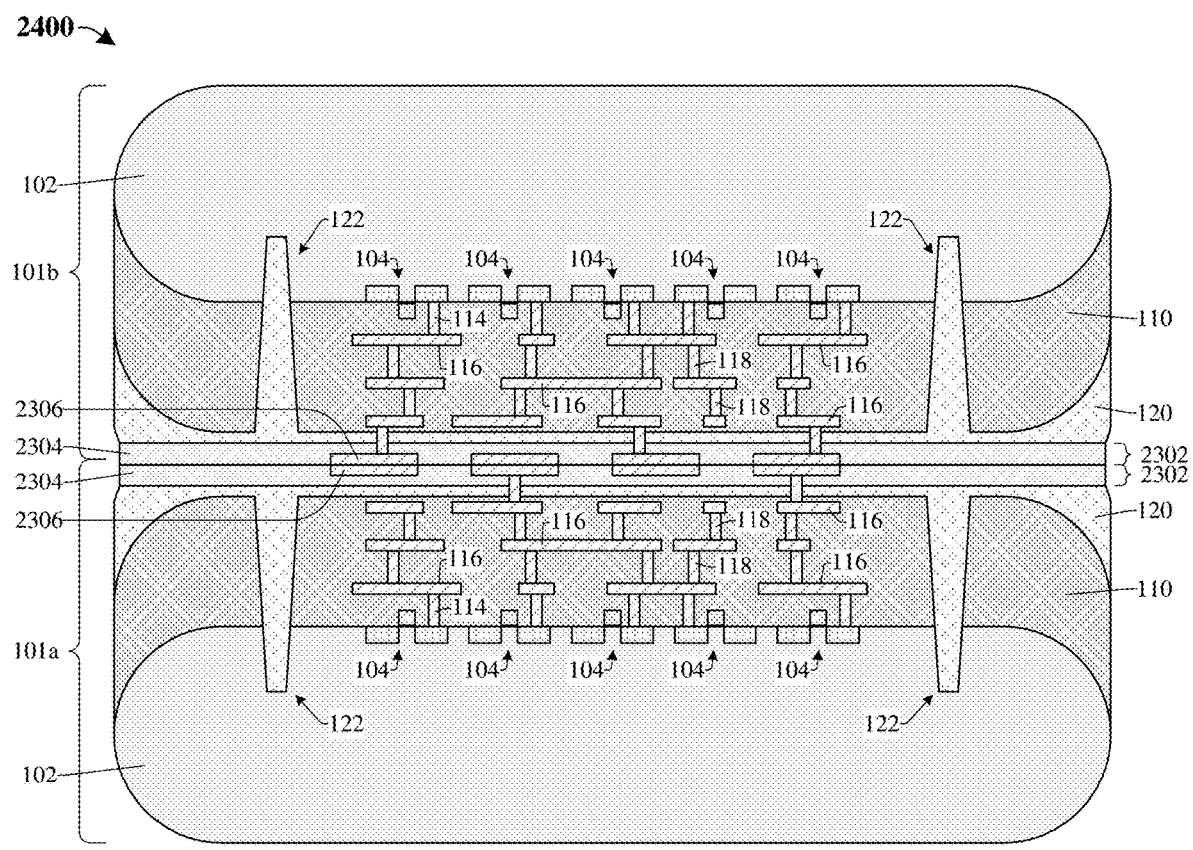

As shown in cross-sectional view 2400 of FIG. 24, a second wafer structure 101*b* (e.g., similar to the first wafer structure 101*a*) is bonded to the first wafer structure 101*a* to form a bonded wafer stack. The second wafer structure 101*b* may, for example, be formed by the same process described for the first wafer structure 101*a* with regard to FIGS. 16-23. The bonding may, for example, comprise a thermal compression bonding process (e.g., hybrid bonding), a fusion bonding process, a polymer adhesive bonding process, or some other suitable bonding process. For example, the second wafer structure 101*b* is inverted and the first and second wafer structures 101*a*, 101*b* are bonded along their respective redistribution structures 2302.

Figure 25:
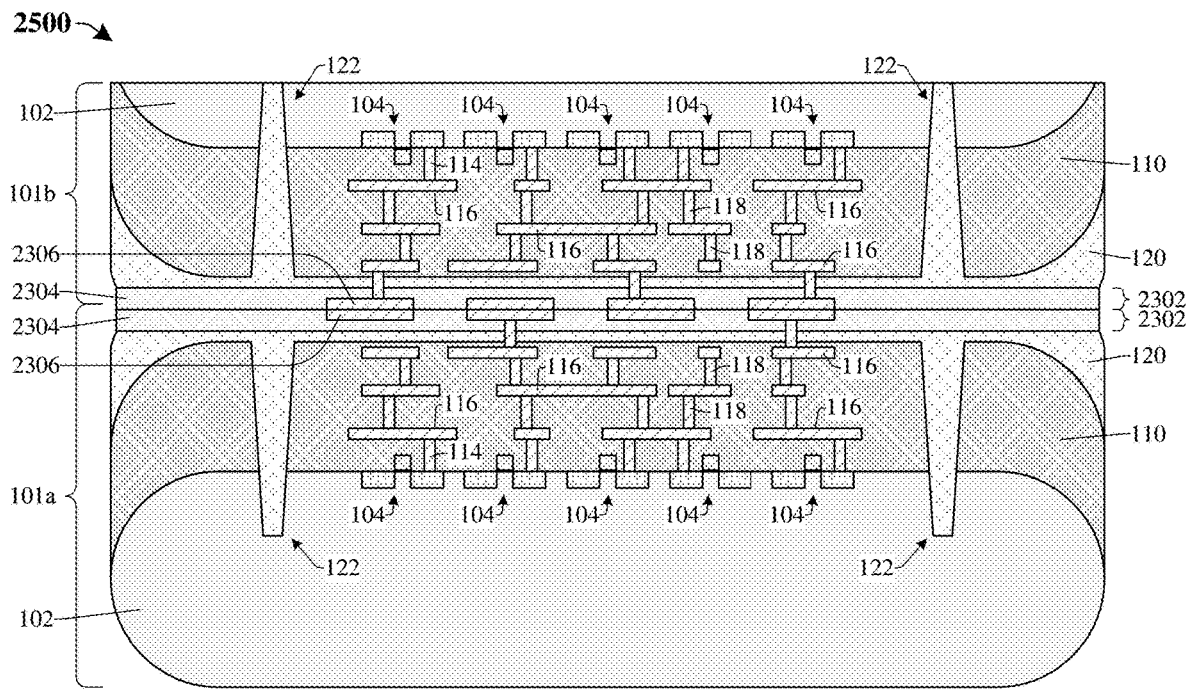

As shown in cross-sectional view 2500 of FIG. 25, a grinding process is performed on a backside of the second wafer structure 101*b*. The grinding process thins the second wafer structure 101*b*. In some embodiments, the grinding thins the substrate 102 of the second wafer structure 101*b* such that the seal ring layer 120 of the second wafer structure 101*b* is exposed as a result of the grinding. In some embodiments, the grinding process comprises a mechanical grinding of a backside surface of the second wafer structure 101*b* using grinding wheel or the like.

Figure 26:
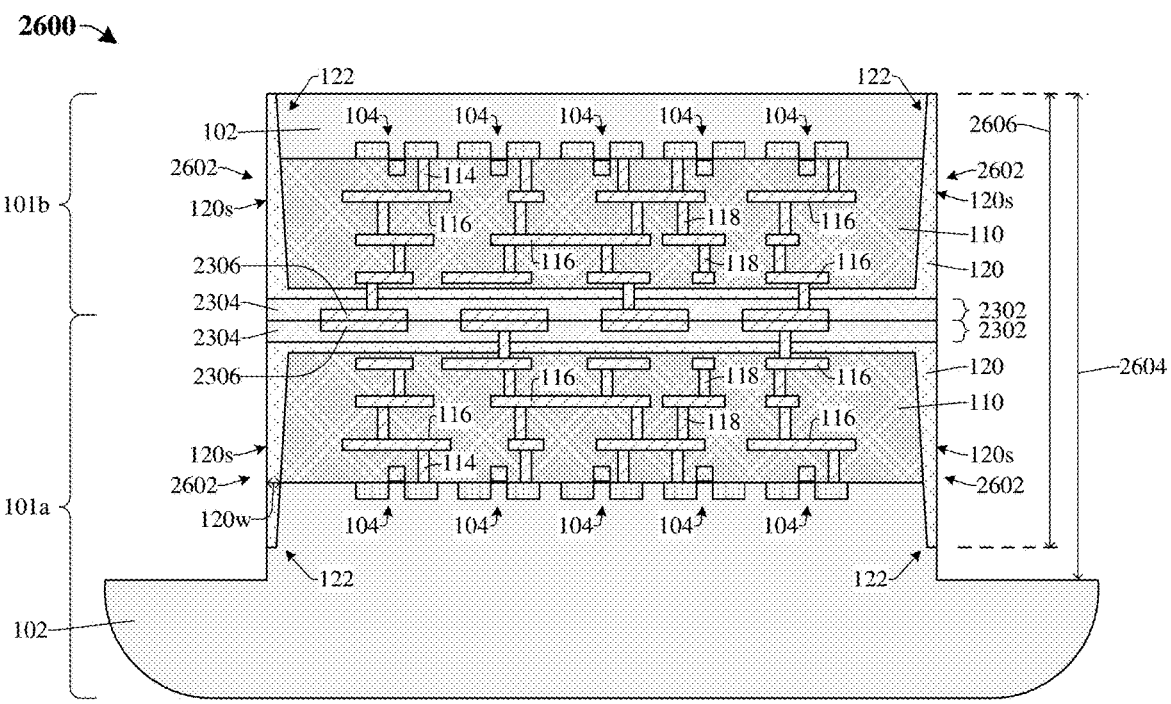

As shown in cross-sectional view 2600 of FIG. 26, the second wafer structure 101*b* and the first wafer structure 101a are trimmed along an edge of the bonded wafer stack (e.g., along edges of the first and second wafer structures 101a, 101b). The trimming is performed along the edge of the bonded wafer stack where the seal ring layers 120 extend into the trenches 122. A trim wall 2602 is formed as a result of the trimming. Sidewalls 120s of the seal ring layers 120 of the first and second wafer structures 101a, 101b delimit the trim wall. In some embodiments, the trimming process comprises bringing a trimming blade into contact with the bonded wafer stack along the edge of the bonded wafer stack in a closed loop. In some embodiments, a depth 2604 of the trim (e.g., a height of the trim wall) is greater than or equal to a depth 2606 of the seal ring layer 120 of the first wafer structure 101a as measured from a backside of the second wafer structure 101b. In some other embodiments, the depth 2604 of the trim (e.g., a height of the trim wall) is less than the depth 2606 of the seal ring layer 120 of the first wafer structure 101a as measured from the backside of the second wafer structure 101b.

Because the seal ring layer 120 is between the trim blade and the dielectric stack 110 during the trimming, and because the seal ring layer 120 comprises a dielectric material that has a reduced susceptibility to damage (e.g., during trimming and/or subsequent processing), the seal ring layer 120 can protect the dielectric stack 110 during the trimming process. Further, because the seal ring layer 120 remains surrounding the dielectric stack 110 after the trimming, the seal ring layer 120 can protect the dielectric stack 110 during subsequent processing. Thus, damage caused to the dielectric stack 110 during the trimming and/or subsequent processing may be prevented or reduced. As a result, a yield of reliable die from the bonded wafer stack may be improved.

In some embodiments, a distance 120w between the trim wall and the inner sidewall of the seal ring layer is in a range of about 0.01 micrometers to 100 micrometers or some other suitable value. In some embodiments, if the distance 120w is less than 0.01 micrometers, the seal ring layer 120 may not be able to fully protect the dielectric stack 110.

Figure 46:
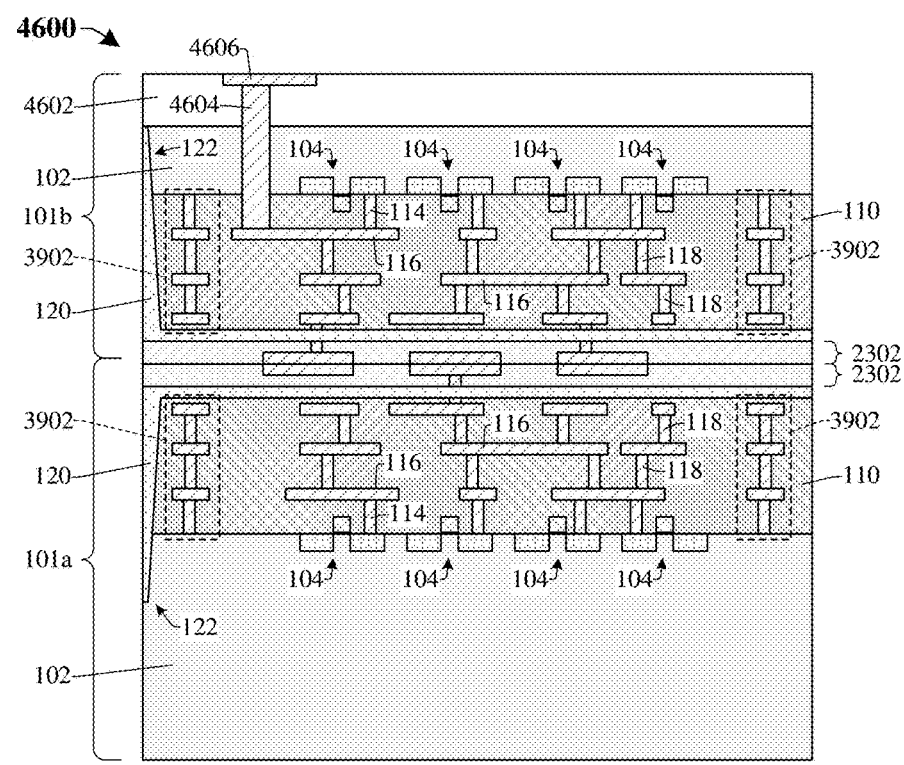
FIG. 46 illustrates a cross-sectional view of some embodiments of a semiconductor die.

In some embodiments, additional processing steps may be performed after the trimming. For example, in some embodiments, the backside of the second wafer structure 101b may be etched (e.g., by way of a dry etching process or the like) and/or planarized (e.g., by way of a CMP or the like) after the trimming to further thin the second wafer structure 101b. The seal ring layer 120 may protect the dielectric stack 110 from damage during the etching and/or the planarization. In some embodiments, a backside dielectric layer (e.g., 4602 of FIG. 47) is formed along the backside of the second wafer structure 101b. In some embodiments, a through-substrate via (TSV) (e.g., 4604 of FIG. 47) is formed within the substrate 102 of the second wafer structure 101b and within the backside dielectric layer. In some embodiments, bond pads (e.g., 4606 of FIG. 47) are formed along a top surface of the backside dielectric layer. In some embodiments, the bonded wafer stack is diced (e.g., using a dicing saw or some other suitable process) along scribe lines to form individual semiconductor die (e.g., as illustrated in FIG. 46) from the bonded wafer stack.

FIGS. 27-37 illustrate cross-sectional views 2700-3700 of some other embodiments of a method for forming a semiconductor wafer structure comprising a dielectric stack 110 over a substrate 102 and a seal ring layer 120 surrounding the dielectric stack 110. Although FIGS. 27-37 are described in relation to a method, it will be appreciated that the structures disclosed in FIGS. 27-37 are not limited to such a method, but instead may stand alone as structures independent of the method.

The method illustrated in FIGS. 27-37 is similar method similar to the method illustrated in FIGS. 16-26. However, in the method illustrated in FIGS. 27-37, the dielectric stack 110 is alternatively formed over a central portion of the substrate 102 but not over the edge of the substrate 102. Subsequently, the trench 122 is formed along the outermost sidewall of the dielectric stack 110 such that the trench laterally surrounds the outermost sidewall of the dielectric stack 110. Thus, when the seal ring layer 120 is subsequently deposited over the dielectric stack 110 and in the trench 122, the seal ring layer 120 is deposited on the substrate 102 along the edge of the substrate 102.

Although FIGS. 27-30 illustrate the dielectric stack 110 being formed prior to the trench 122 being formed in the substrate 102, in some other embodiments, the trench 122 may alternatively be formed in the substrate 102 prior to the formation of the dielectric stack 110. In other words, the trench 122 may be formed in the substrate 102 and the dielectric stack 110 may be subsequently formed over the substrate 102 between sidewalls of the substrate 102 that delimit the trench 122.

Figure 38:
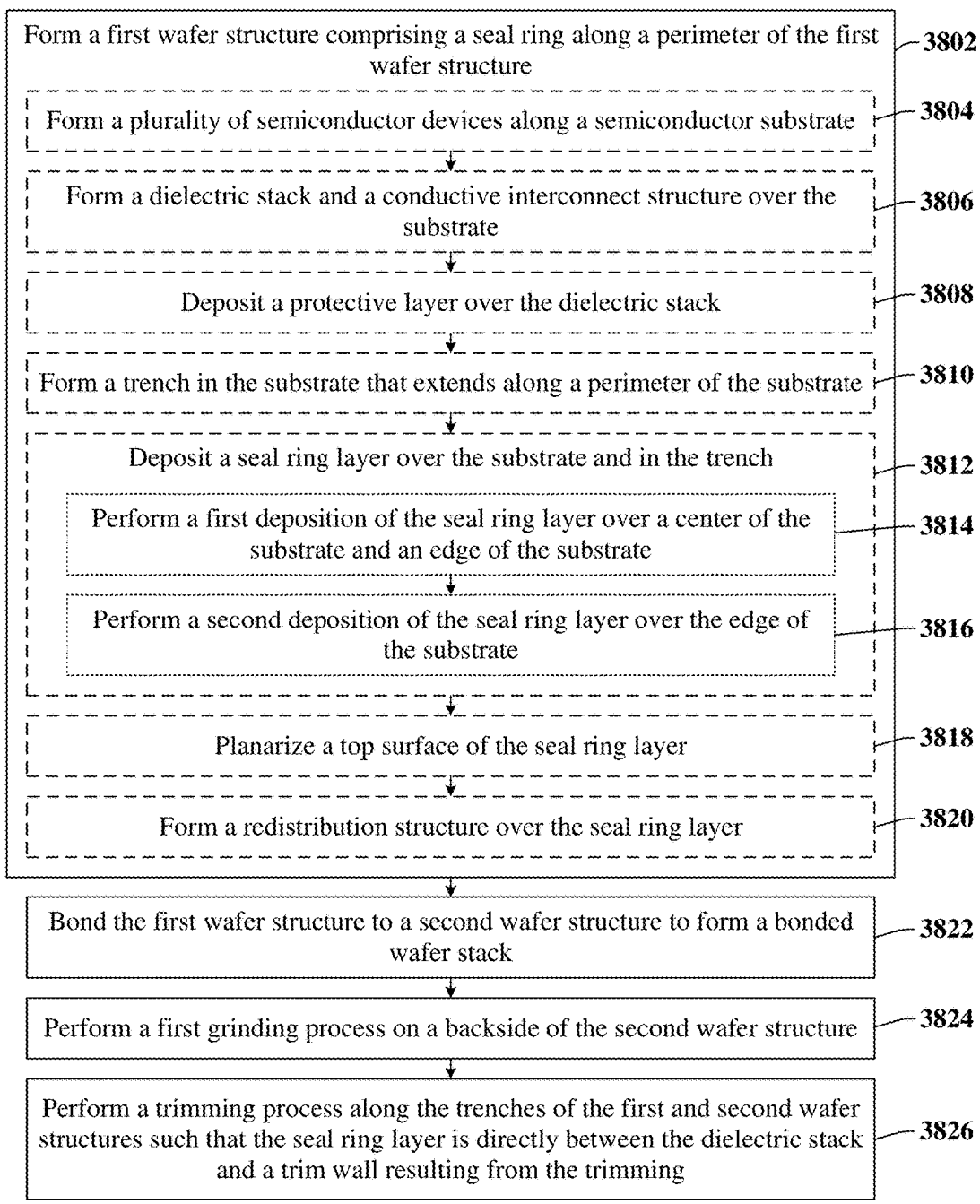
FIG. 38 illustrates a flow diagram of some embodiments of a method for forming a semiconductor wafer structure comprising a dielectric stack over a substrate and a seal ring layer surrounding the dielectric stack.

FIG. 38 illustrates a flow diagram of some embodiments of a method 3800 for forming a semiconductor wafer structure comprising a dielectric stack over a substrate and a seal ring layer surrounding the dielectric stack. While method 3800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 3802, form a first wafer structure comprising a seal ring along a perimeter of the first wafer structure. FIGS. 16-23 illustrate cross-sectional views 1600-2300 of some embodiments corresponding to block 3802. FIGS. 27-34 illustrate cross-sectional views 2700-3400 of some embodiments that also correspond to block 3802. In some embodiments, block 3802 comprises blocks 3804, 3806, 3808, 3810, 3812, and 3818.

Figure 27:
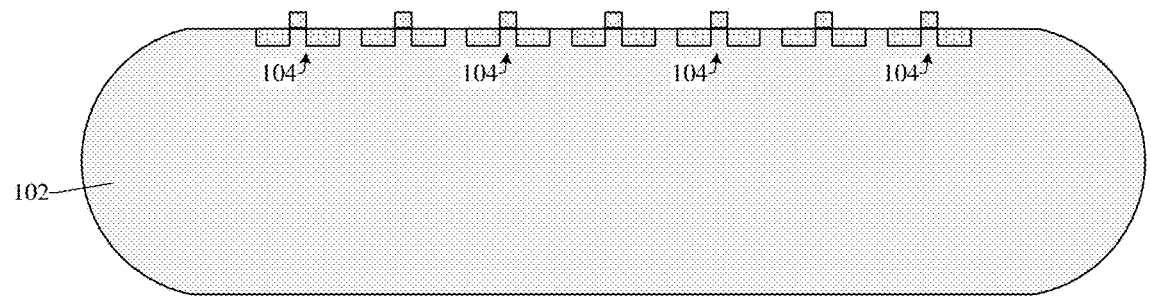
FIGS. 27-37 illustrate cross-sectional views of some other embodiments of a method for forming a semiconductor wafer structure comprising a dielectric stack over a substrate and a seal ring layer surrounding the dielectric stack.

At block 3804, form a plurality of semiconductor devices along a semiconductor substrate. FIG. 16 illustrates a cross-sectional view 1600 of some embodiments corresponding to block 3804. FIG. 27 illustrates a cross-sectional view 2700 of some embodiments that also correspond to block 3804.

Figure 28:
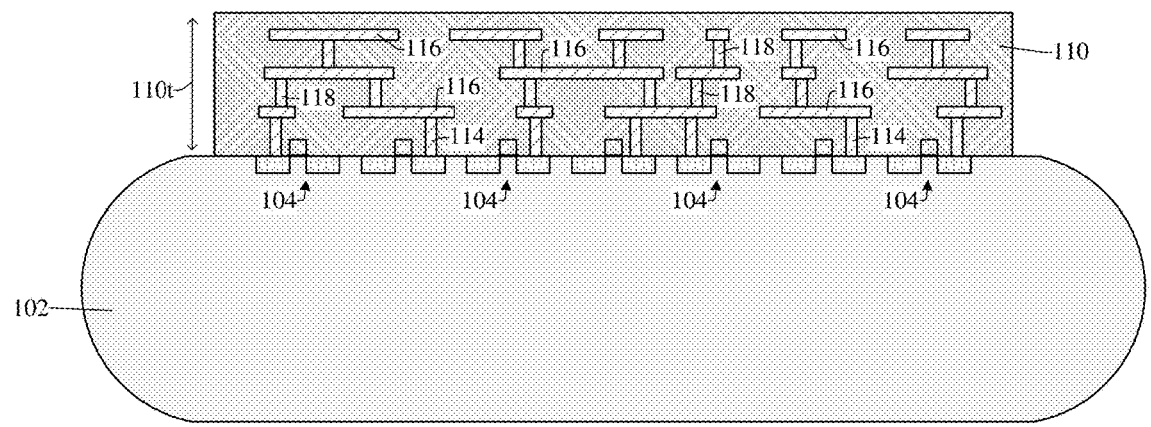

At block 3806, form a dielectric stack and a conductive interconnect structure over the substrate. The conductive interconnect structure is disposed within the dielectric stack. FIG. 17 illustrates a cross-sectional view 1700 of some embodiments corresponding to block 3806. FIG. 28 illustrates a cross-sectional view 2800 of some embodiments that also correspond to block 3806.

Figure 29:
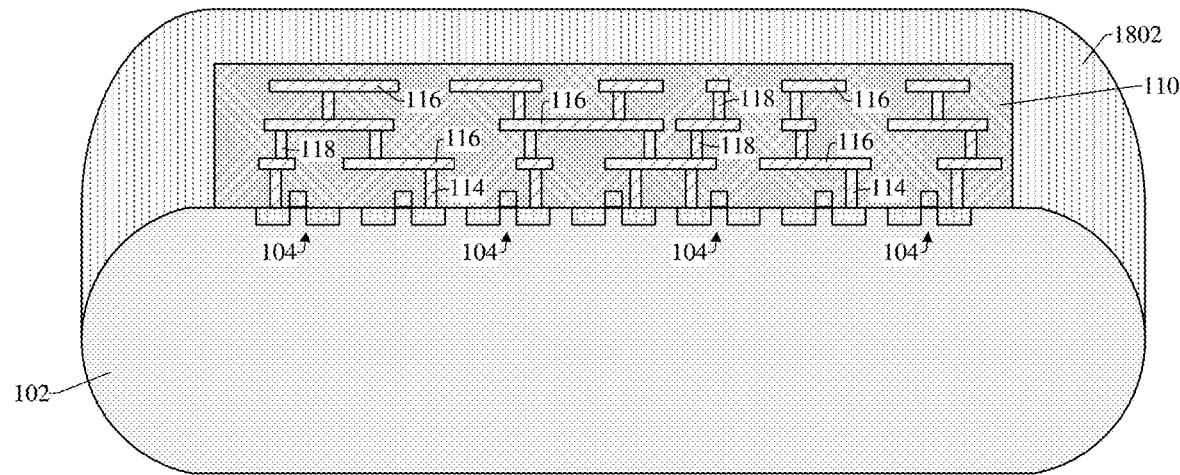

At block 3808, deposit a protective layer over the dielectric stack. FIG. 18 illustrates a cross-sectional view 1800 of some embodiments corresponding to block 3808. FIG. 29 illustrates a cross-sectional view 2900 of some embodiments that also correspond to block 3808.

Figure 30:
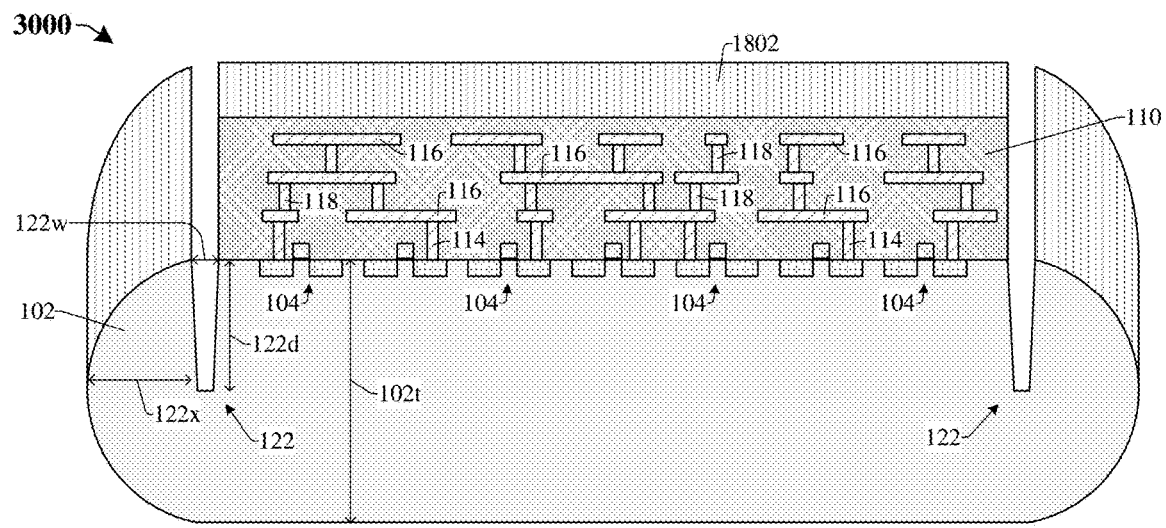

At block 3810, form a trench in the substrate that extends along a perimeter of the substrate. FIG. 19 illustrates a cross-sectional view 1900 of some embodiments corresponding to block 3810. FIG. 30 illustrates a cross-sectional view 3000 of some embodiments that also correspond to block 3810.

Figure 31:
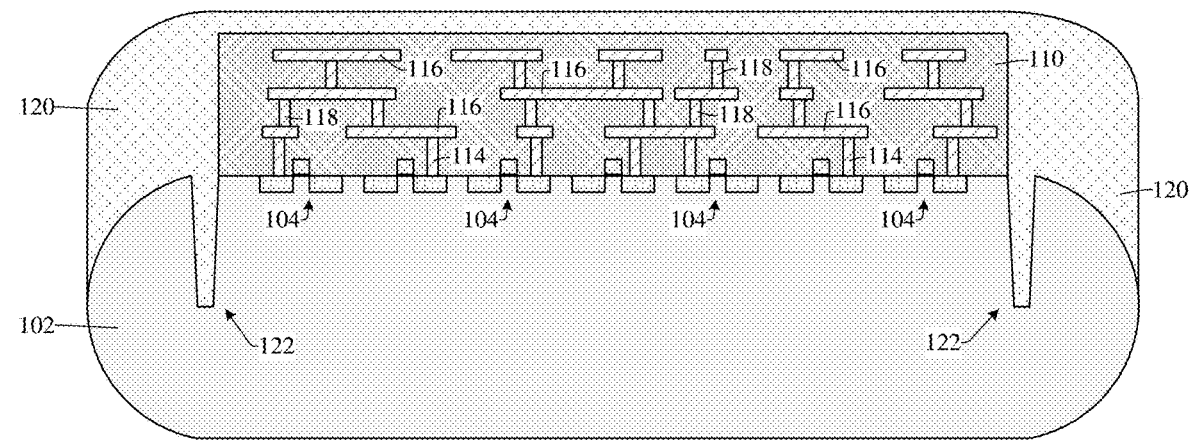
Figure 32:
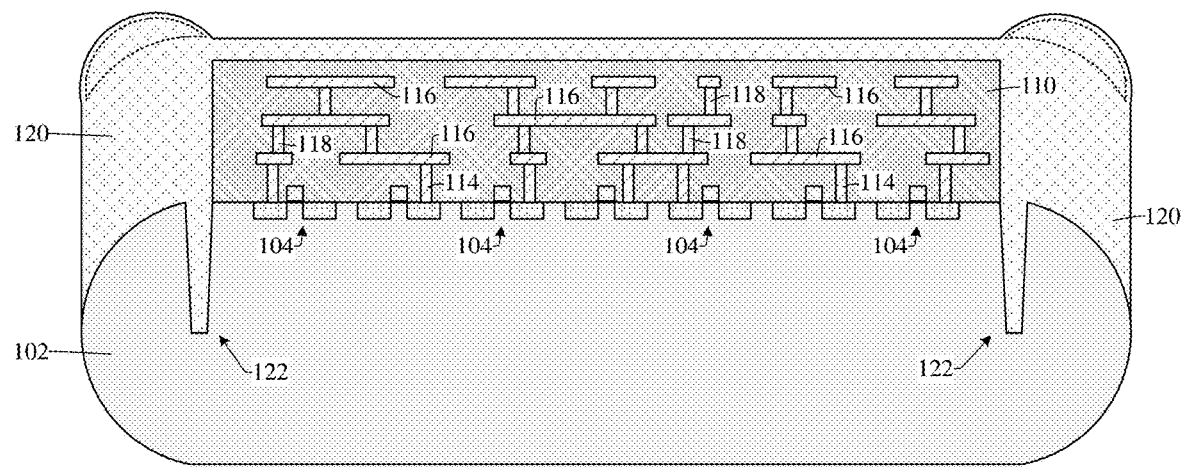

At block 3812, deposit a seal ring layer over the substrate and in the trench. FIGS. 20 and 21 illustrate cross-sectional views 2000 and 2100 of some embodiments corresponding to block 3812. FIGS. 31 and 32 illustrate cross-sectional views 3100 and 3200 of some embodiments that also correspond to block 3812. In some embodiments, block 3812 comprises blocks 3814 and 3816.

At block 3814, perform a first deposition of the seal ring layer over a center of the substrate and an edge of the substrate. FIG. 20 illustrates a cross-sectional view 2000 of some embodiments corresponding to block 3814. FIG. 31 illustrates a cross-sectional view 3100 of some embodiments that also correspond to block 3814.

At block 3816, perform a second deposition of the seal ring layer over the edge of the substrate. FIG. 21 illustrates a cross-sectional view 2100 of some embodiments corresponding to block 3816. FIG. 32 illustrates a cross-sectional view 3200 of some embodiments that also correspond to block 3816.

Figure 33:
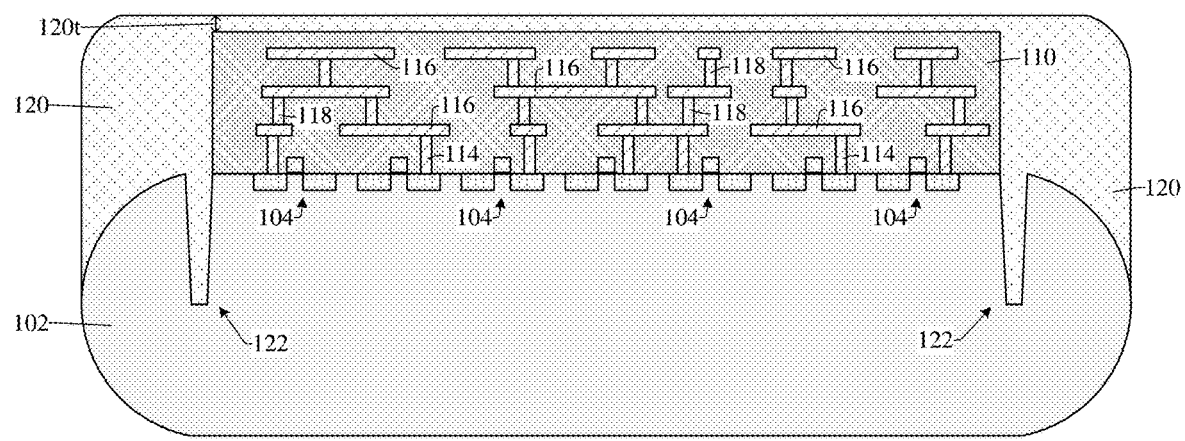

At block 3818, planarize a top surface of the seal ring layer. FIG. 22 illustrates a cross-sectional view 2200 of some embodiments corresponding to block 3818. FIG. 33 illustrates a cross-sectional view 3300 of some embodiments that also correspond to block 3818.

Figure 34:
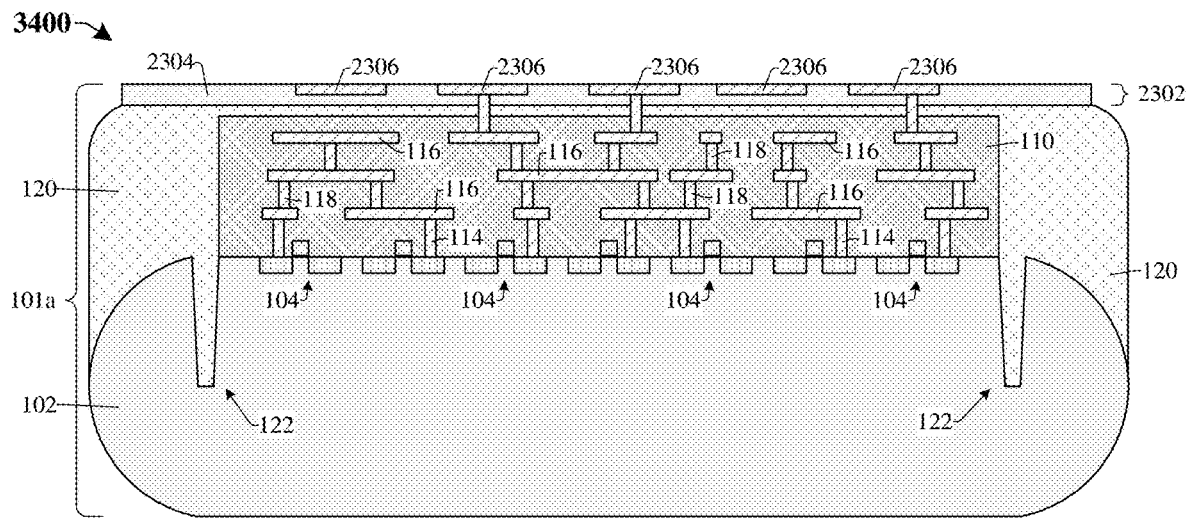

At block 3820, form a redistribution structure over the seal ring layer. FIG. 23 illustrates a cross-sectional view 2300 of some embodiments corresponding to block 3820. FIG. 34 illustrates a cross-sectional view 3400 of some embodiments that also correspond to block 3820.

Figure 35:
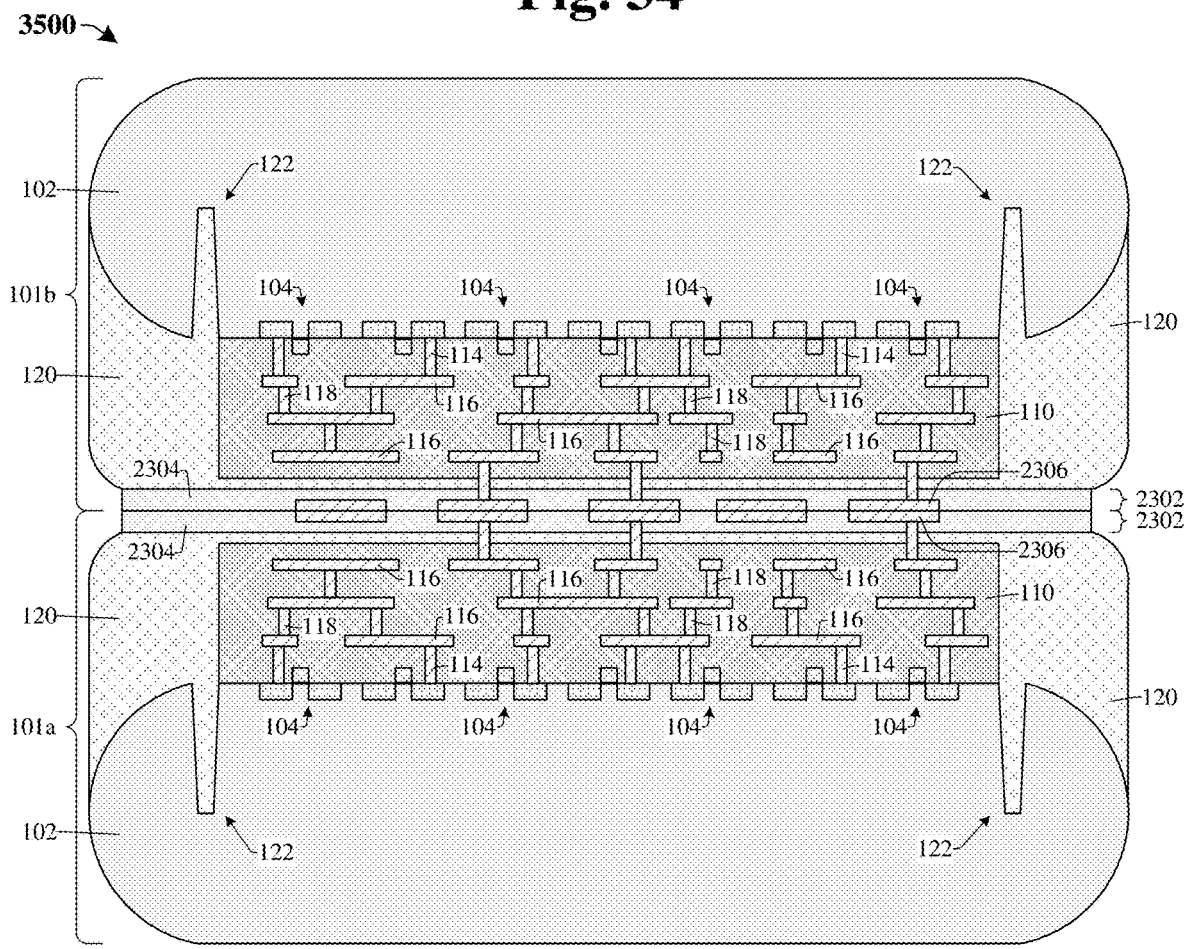

At block 3822, bond the first wafer structure to a second wafer structure to form a bonded wafer stack. FIG. 24 illustrates a cross-sectional view 2400 of some embodiments corresponding to block 3822. FIG. 35 illustrates a cross-sectional view 3500 of some embodiments that also correspond to block 3822.

Figure 36:
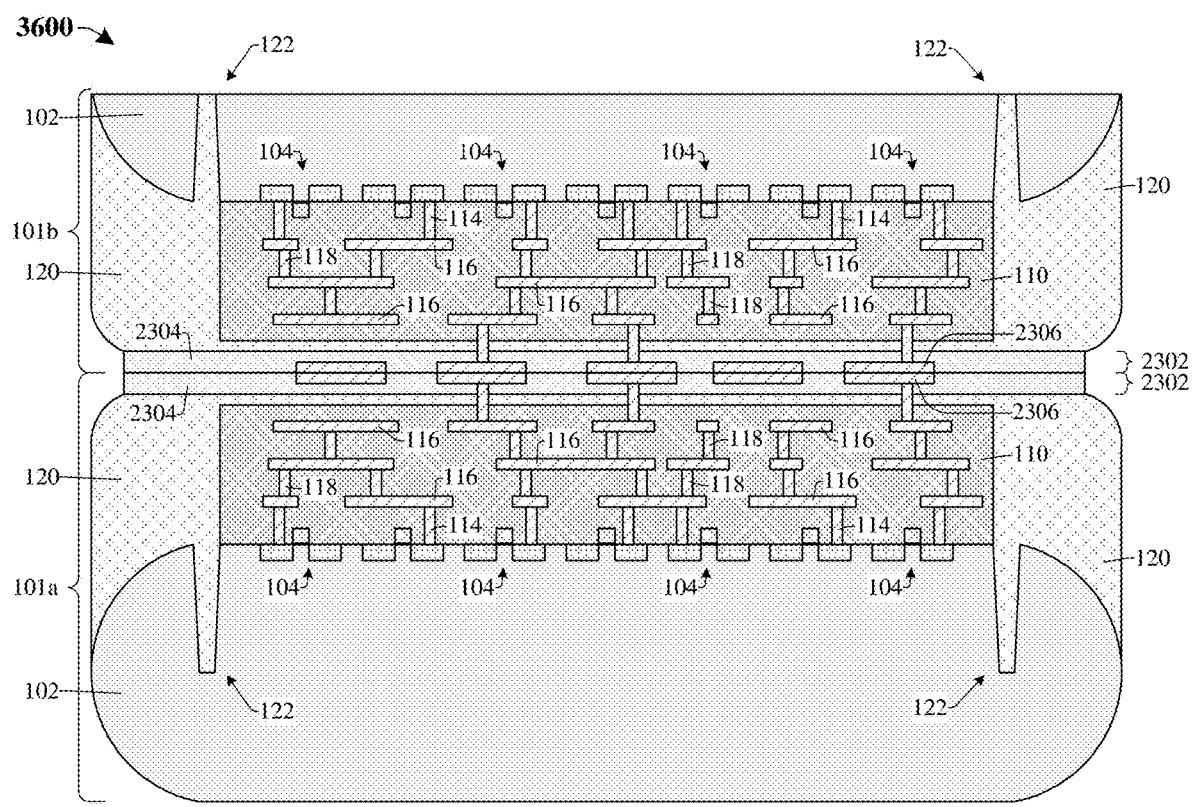

At block 3824, perform a first grinding process on a backside of the second wafer structure. FIG. 25 illustrates a cross-sectional view 2500 of some embodiments corresponding to block 3824. FIG. 36 illustrates a cross-sectional view 3600 of some embodiments that also correspond to block 3824.

Figure 37:
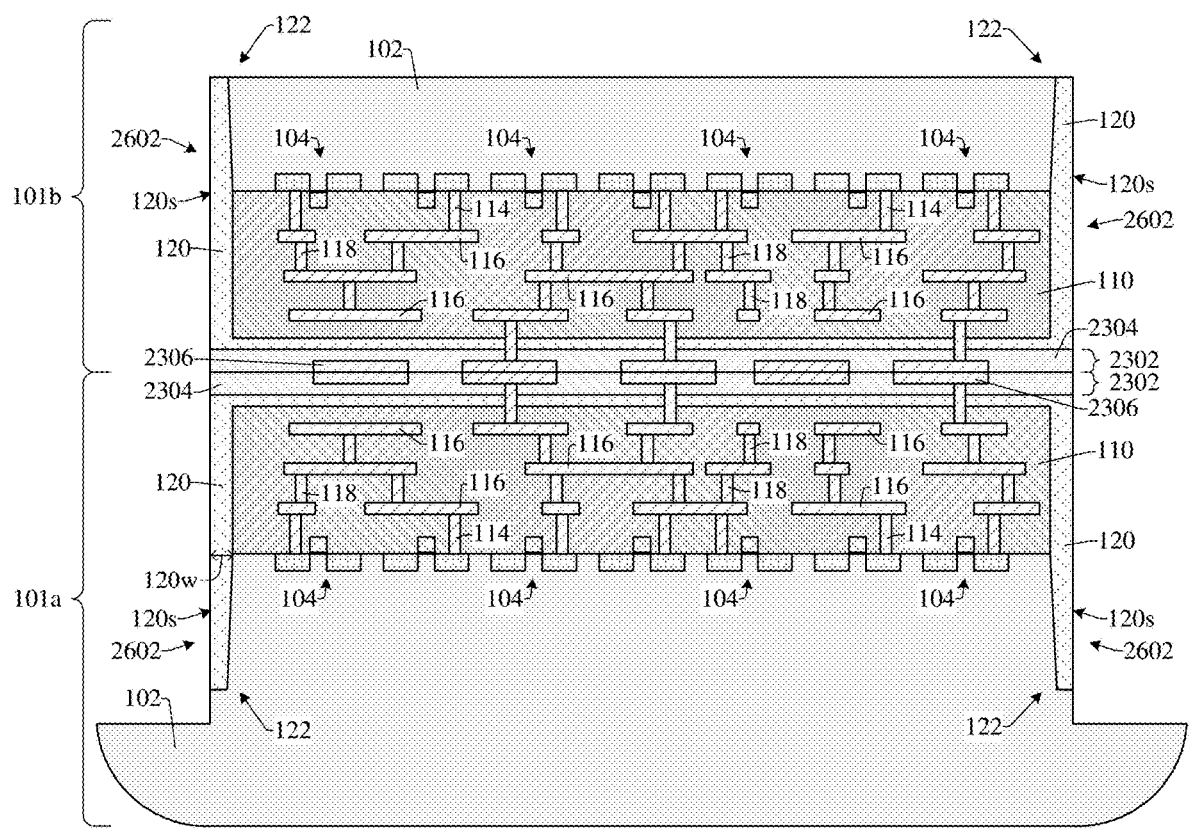

At block 3826, perform a trimming process along the trenches of the first and second wafer structures such that the seal ring layer is directly between the dielectric stack and a trim wall resulting from the trimming. FIG. 26 illustrates a cross-sectional view 2600 of some embodiments corresponding to block 3826. FIG. 37 illustrates a cross-sectional view 3700 of some embodiments that also correspond to block 3826.

Figure 39:
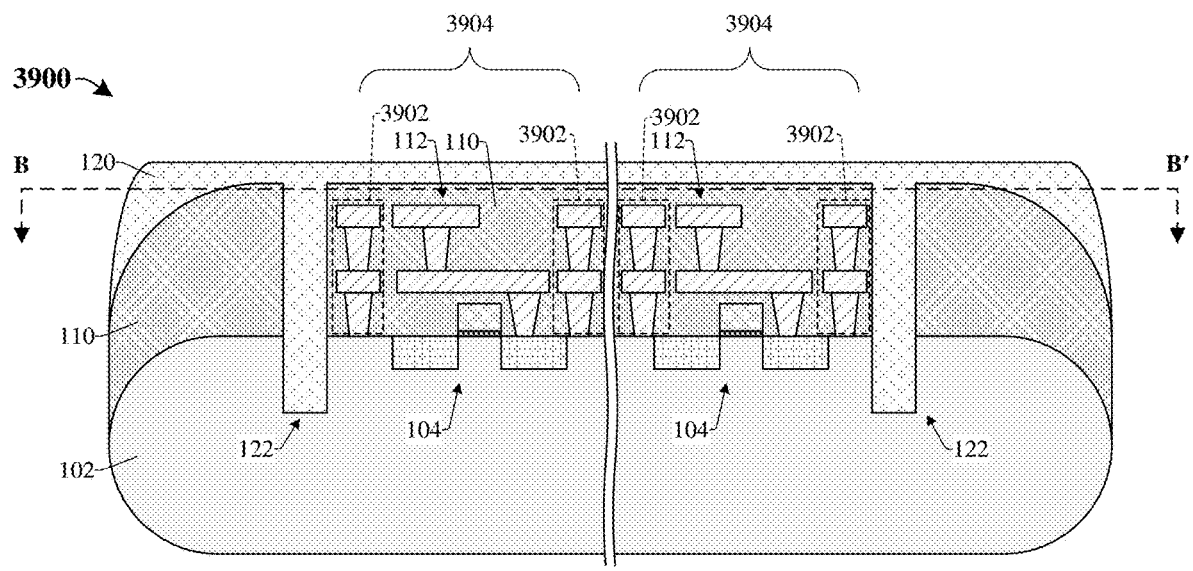
FIG. 39 illustrates a cross-sectional view of some other embodiments of the semiconductor wafer structure of FIG. 1.
Figure 40:
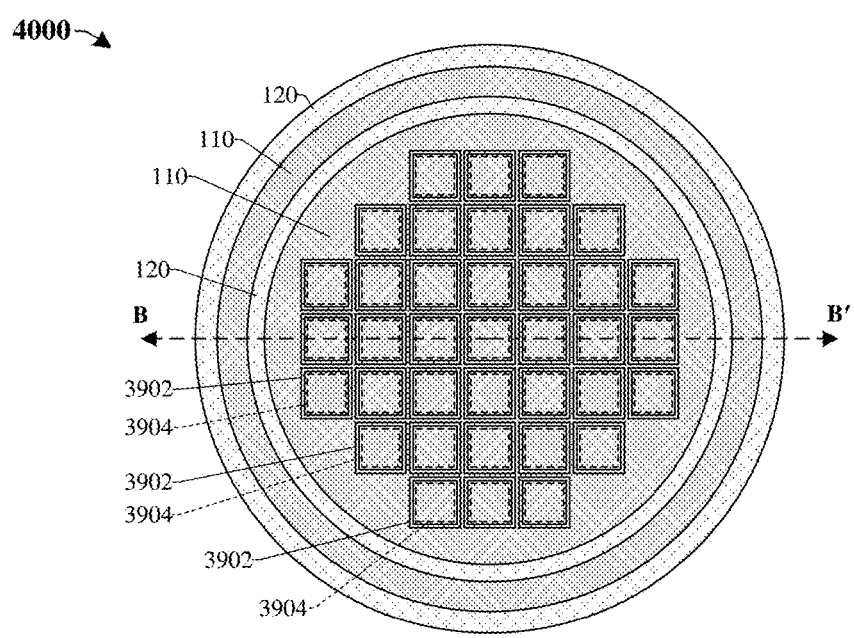
FIG. 40 illustrates a top view of some embodiments of the semiconductor wafer structure of FIG. 39.

FIG. 39 illustrates a cross-sectional view 3900 of some embodiments of the semiconductor wafer structure of FIG. 1 in which a die-level seal ring 3902 is arranged within the dielectric stack 110. FIG. 40 illustrates a top view 4000 of some embodiments of the semiconductor wafer structure of FIG. 39. In some embodiments, the cross-sectional view 3900 of FIG. 39 may be taken across line B-B' of FIG. 40.

Referring to FIG. 39 and FIG. 40 simultaneously, the semiconductor wafer structure includes a plurality of semiconductor die 3904. In some embodiments, each of the semiconductor die 3904 have a corresponding die-level seal ring 3902 that surrounds the semiconductor die 3904. In some embodiments, the die-level seal ring 3902 includes a plurality of conductive features that are stacked on top of one another to form a conductive barrier that surrounds the semiconductor die 3904. The die-level seal rings 3902 are separate from the seal ring layer 120, which comprises a dielectric and forms a wafer-level seal ring.

FIGS. 41-45 illustrate cross-sectional views 4100-4500 of some embodiments of a bonded semiconductor wafer stack.

Figure 41:
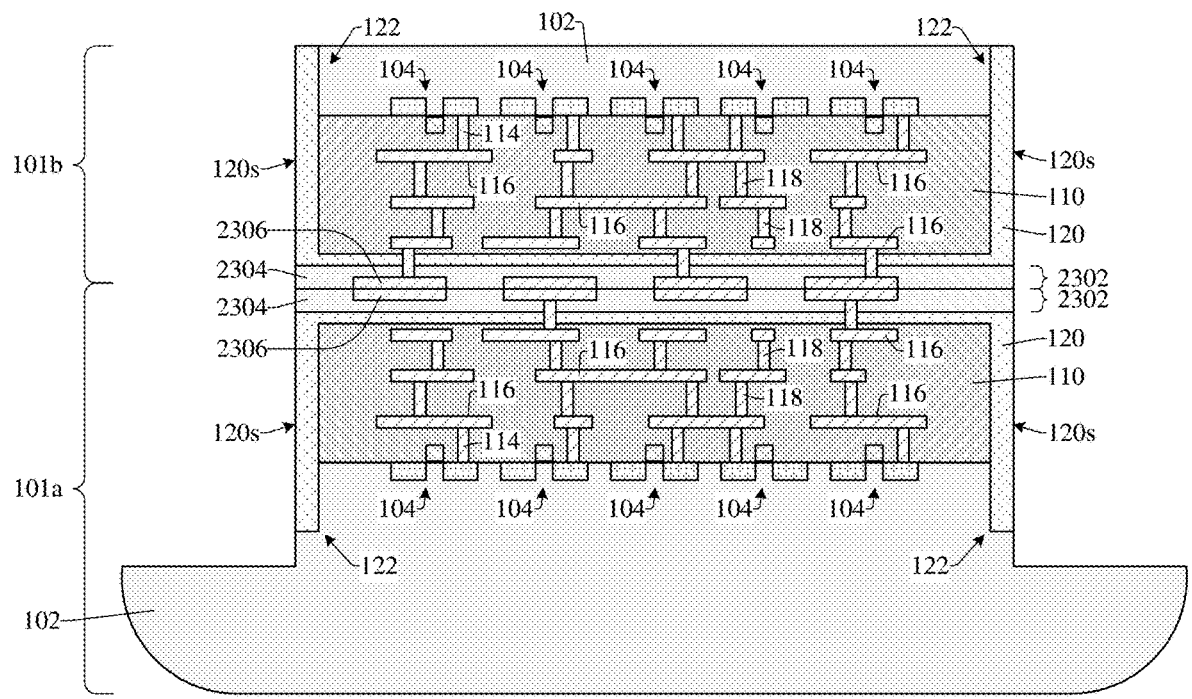
FIGS. 41-45 illustrate cross-sectional views of some embodiments of a bonded semiconductor wafer stack.
Figure 42:
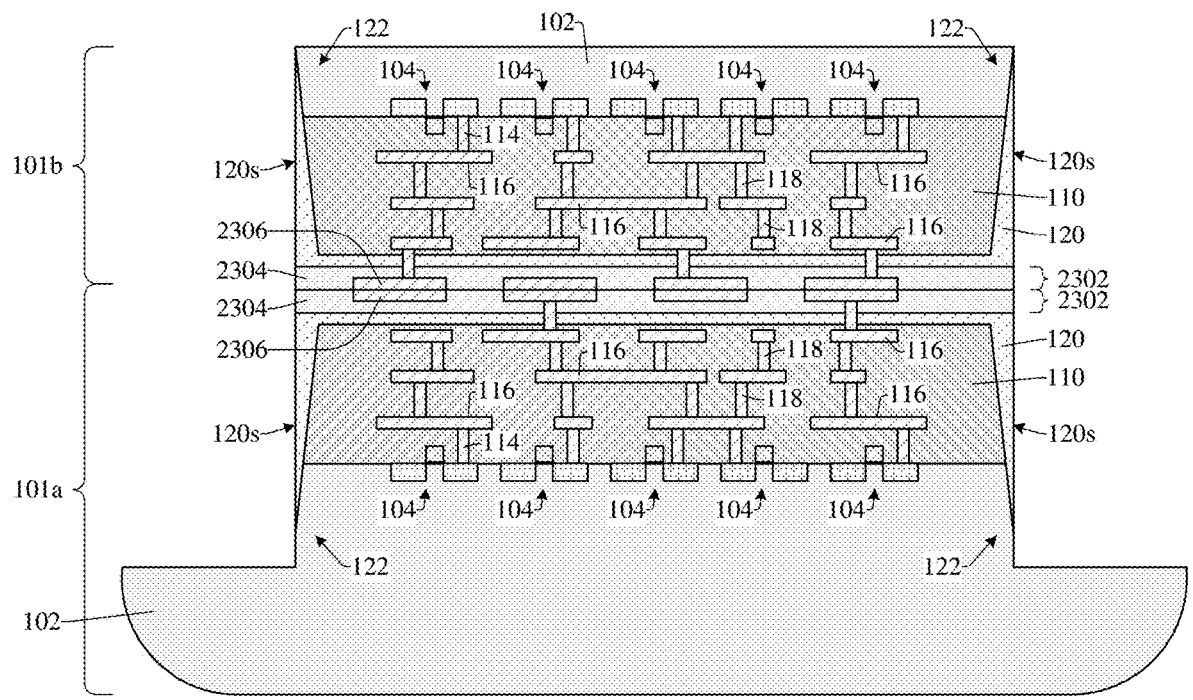
Figure 43:
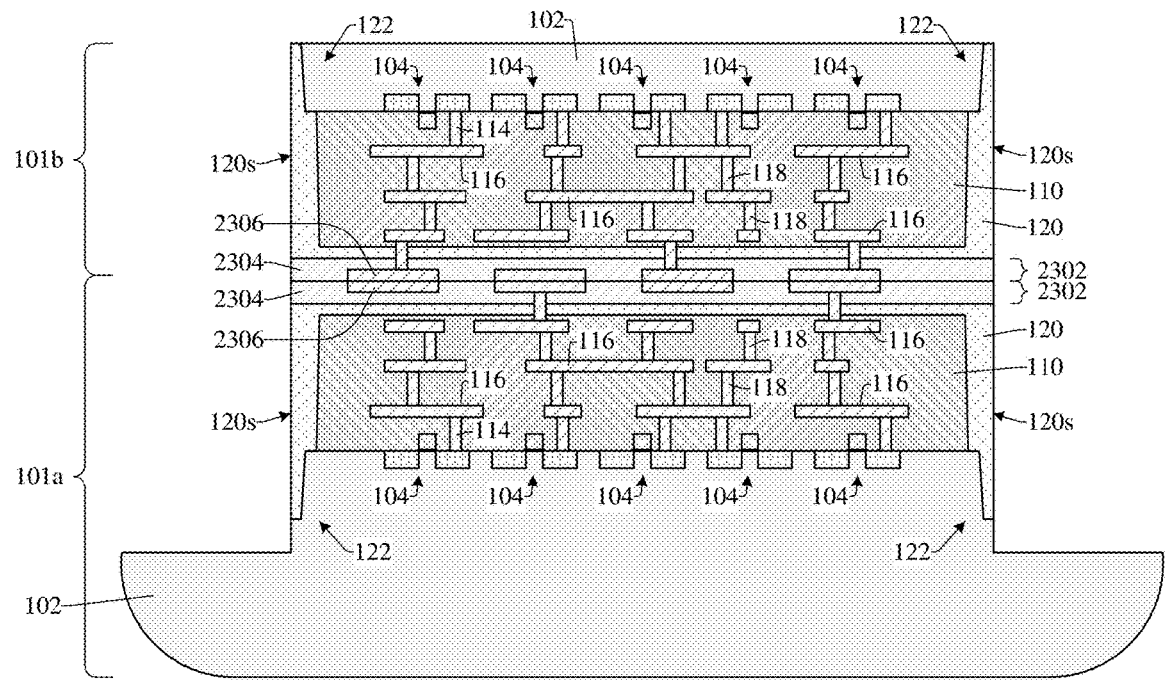
Figure 44:
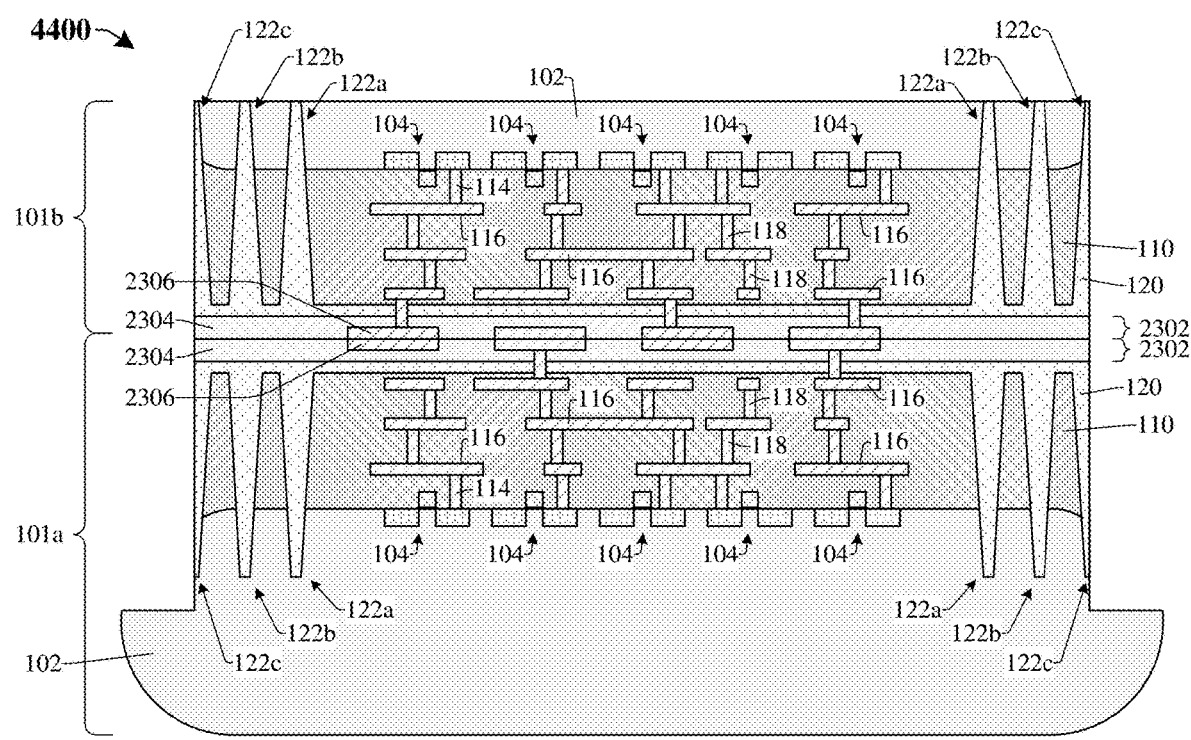
Figure 45:
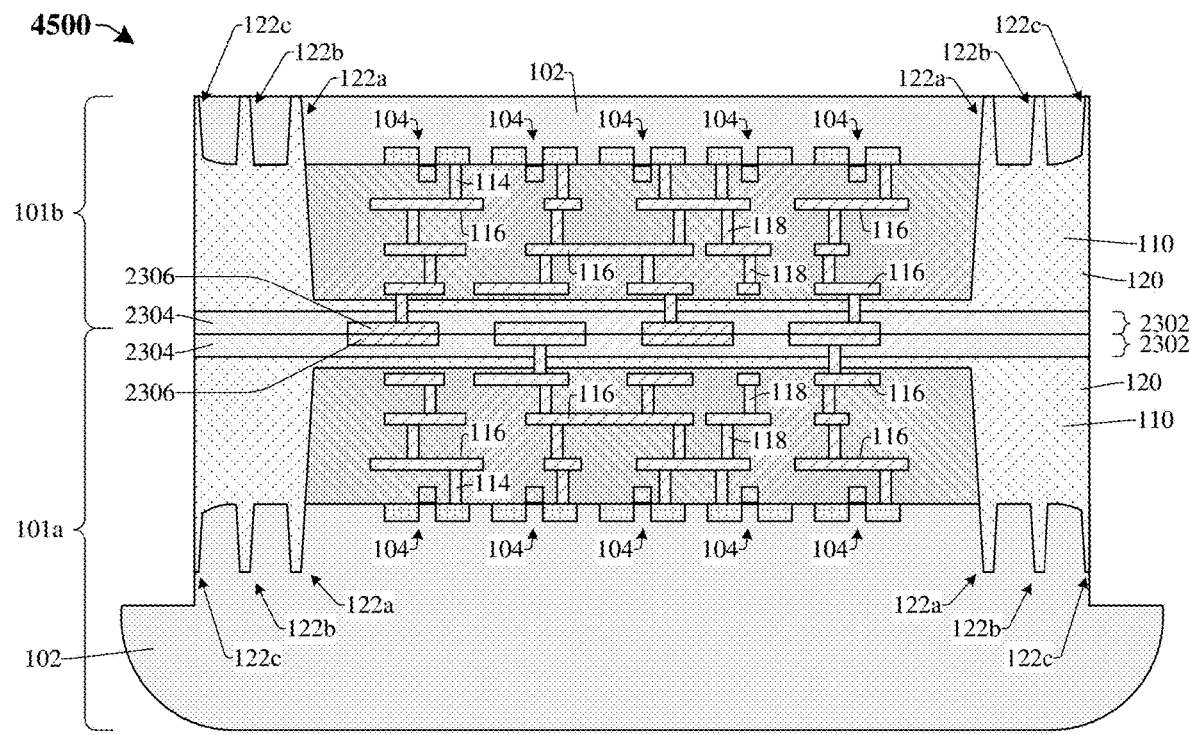

The bonded wafer stacks illustrated in FIGS. 41-45 are similar, for example, to those illustrated in FIG. 26 and FIG. 37. FIG. 41 illustrates a bonded wafer stack resulting from, for example, bonding and processing (e.g., grinding, trimming, etc., as illustrated in FIGS. 23-26 and/or FIGS. 34-37) a first wafer structure 101a and a second wafer structure 101b that are similar to the wafer structures illustrated in FIG. 1 and/or FIG. 3. FIG. 42 illustrates a bonded wafer stack resulting from, for example, bonding and processing a first wafer structure 101a and a second wafer structure 101b that are similar to the wafer structures illustrated in FIG. 6 and/or FIG. 7. FIG. 43 illustrates a bonded wafer stack resulting from, for example, bonding and processing a first wafer structure 101a and a second wafer structure 101b that are similar to the wafer structures illustrated in FIG. 12 and/or FIG. 13. FIG. 44 illustrates a bonded wafer stack resulting from, for example, bonding and processing a first wafer structure 101a and a second wafer structure 101b that are similar to the wafer structure illustrated in FIG. 14. FIG. 45 illustrates a bonded wafer stack resulting from, for example, bonding and processing a first wafer structure 101a and a second wafer structure 101b that are similar to the wafer structure illustrated in FIG. 15.

FIG. 46 illustrates a cross-sectional view 4600 of some embodiments of a semiconductor die including the seal ring layer 120.

In some embodiments, the die includes both the seal ring layer 120 (e.g., the wafer-level seal ring) and a die-level seal ring 3902 that surrounds the die. In some embodiments, the die illustrated in FIG. 46 is a product of processing and dicing a bonded wafer structure that is similar, for example, to any of those illustrated in FIGS. 26, 37, and 41-45. For example, a backside dielectric layer 4602 is formed along a backside of the second wafer structure 101b; a through-substrate via (TSV) 4604 is formed in the substrate 102 of the second wafer structure 101b and in the backside dielectric layer 4602; a bond pad 4606 is formed along a top surface of the backside dielectric layer 4602; and the bonded wafer structure is diced into individual die.

FIGS. 47-51 illustrate cross-sectional views 4700-5100 of some other embodiments of a method for forming a semiconductor wafer structure.

Figure 47:
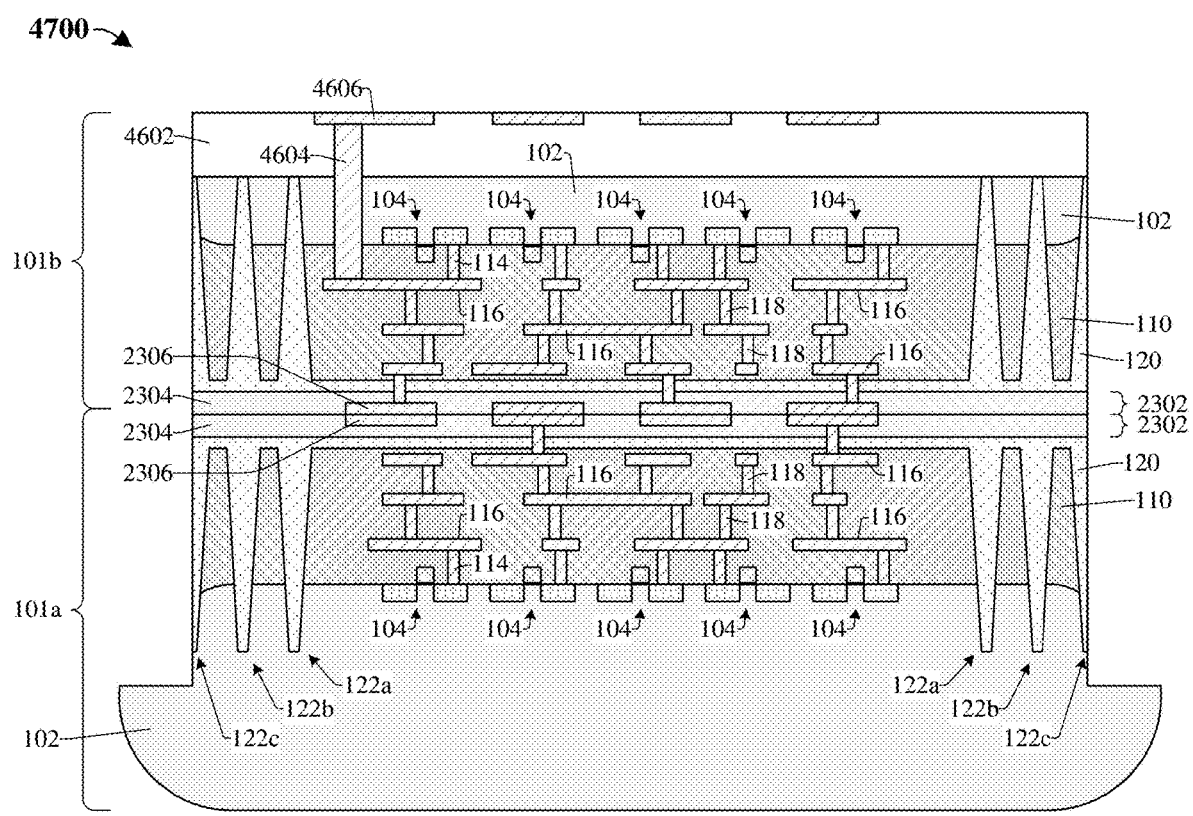
FIGS. 47-51 illustrate cross-sectional views of some other embodiments of a method for forming a semiconductor wafer structure.

As shown in cross-sectional view 4700 of FIG. 47, a first wafer structure 101a, that is similar to the wafer structure illustrated in FIG. 14, is formed (e.g., as illustrated in FIGS. 16-23); a second wafer structure 101b, similar to the first wafer structure 101a, is bonded (e.g., as illustrated in FIG. 24) to the first wafer structure 101a; the second wafer structure 101b is grinded (e.g., as illustrated in FIG. 25); the first and second wafer structures 101a, 101b are trimmed (e.g., as illustrated in FIG. 26) along a third protrusion (not labeled) of the seal ring layer 120; a backside dielectric layer 4602 is formed along a backside of the second wafer structure 101b; a TSV 4604 is formed within the substrate 102 of the second wafer structure 101b and within the backside dielectric layer 4602; and bond pads 4606 are formed along a top surface of the backside dielectric layer 4602.

Figure 48:
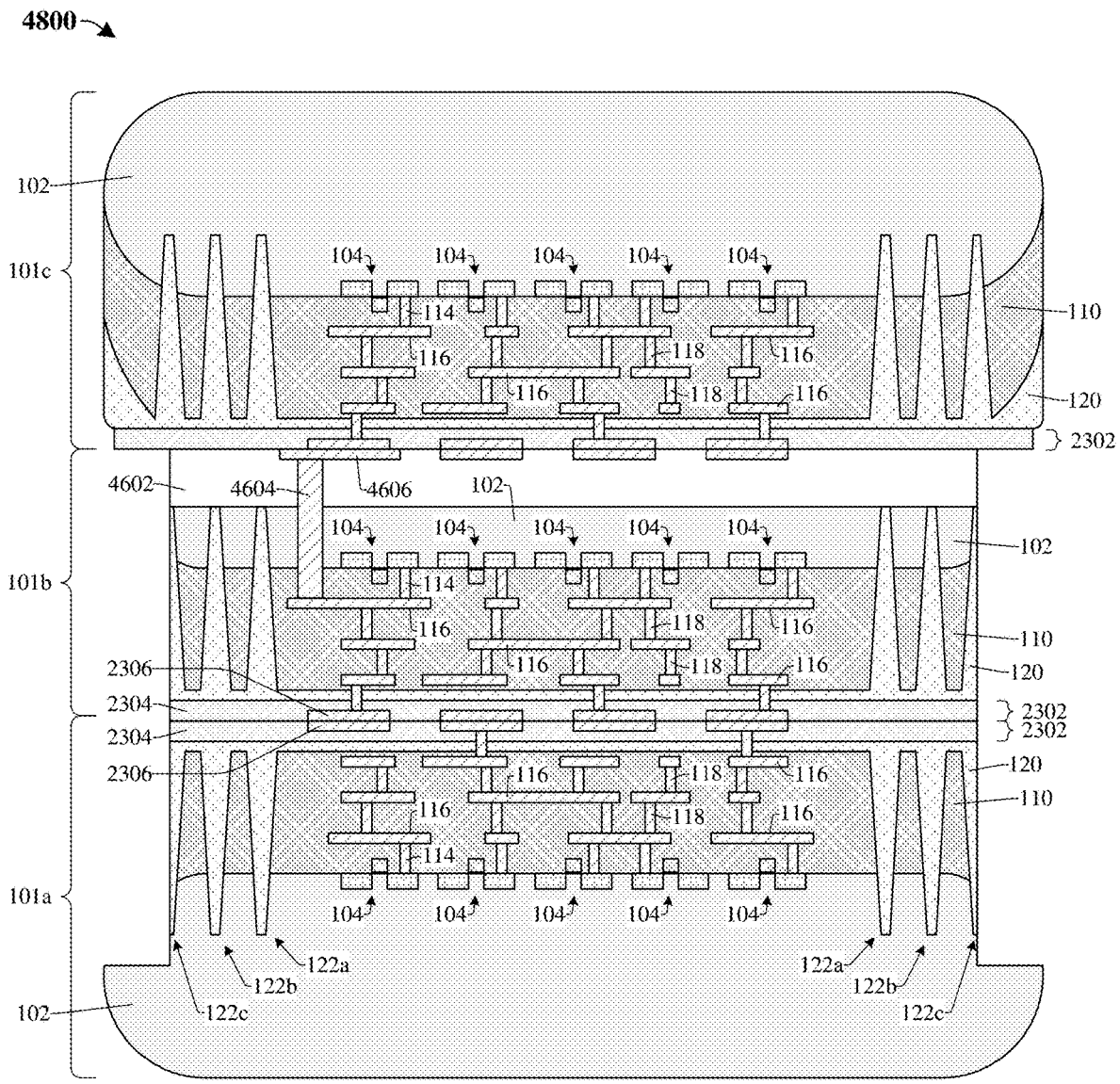

As shown in cross-sectional view 4800 of FIG. 48, a third wafer structure 101c, similar to the first wafer structure 101a and/or the second wafer structure 101b, is bonded to the second wafer structure 101b along the bond pads 4606 of the second wafer structure 101b.

Figure 49:
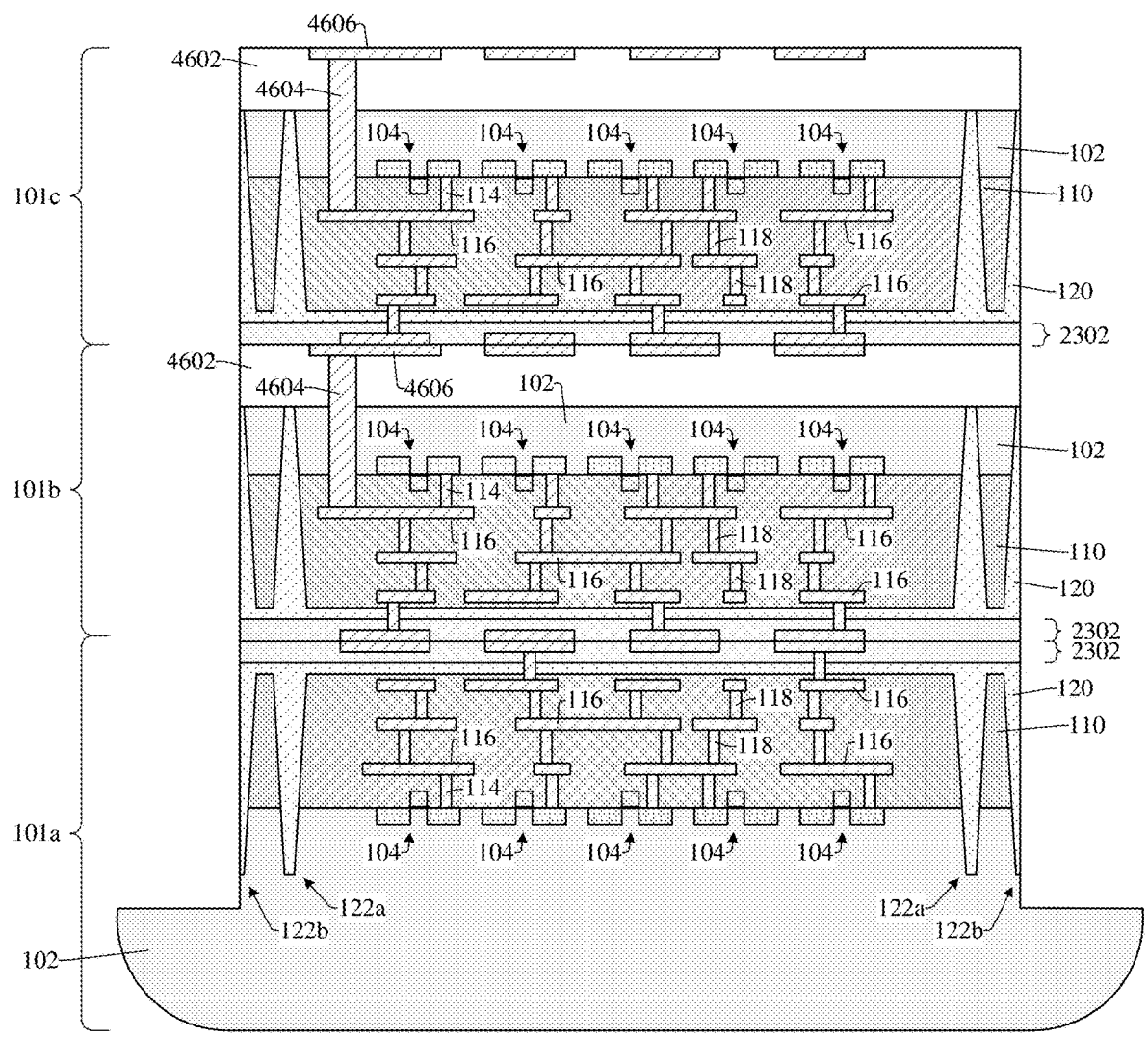

As shown in cross-sectional view 4900 of FIG. 49, the third wafer structure 101c is grinded; the first, second, and third wafer structures 101a, 101b, 101c are trimmed along a second protrusion (not labeled) of the seal ring layer 120; a backside dielectric layer 4602 is formed along a backside of the third wafer structure 101c; a TSV 4604 is formed within the substrate 102 of the third wafer structure 101c and within the backside dielectric layer 4602 of the third wafer structure 101c; and bond pads 4606 are formed along a top surface of the backside dielectric layer 4602 of the third wafer structure 101c.

Figure 50:
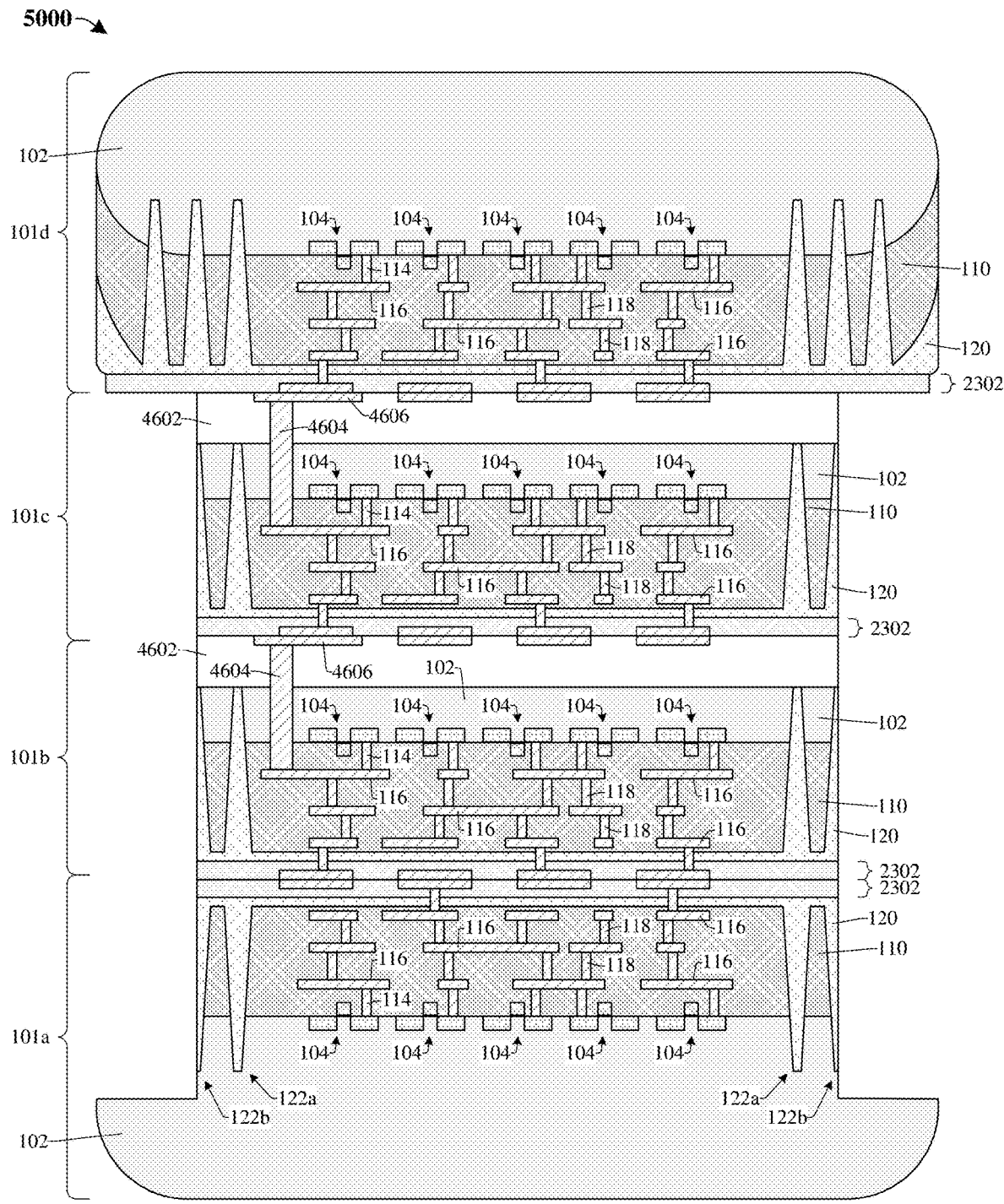

As shown in cross-sectional view 5000 of FIG. 50, a fourth wafer structure 101d, similar to the first wafer structure 101a, the second wafer structure 101b, and/or the third wafer structure 101c, is bonded to the third wafer structure 101c along the bond pads 4606 of the third wafer structure 101c.

Figure 51:
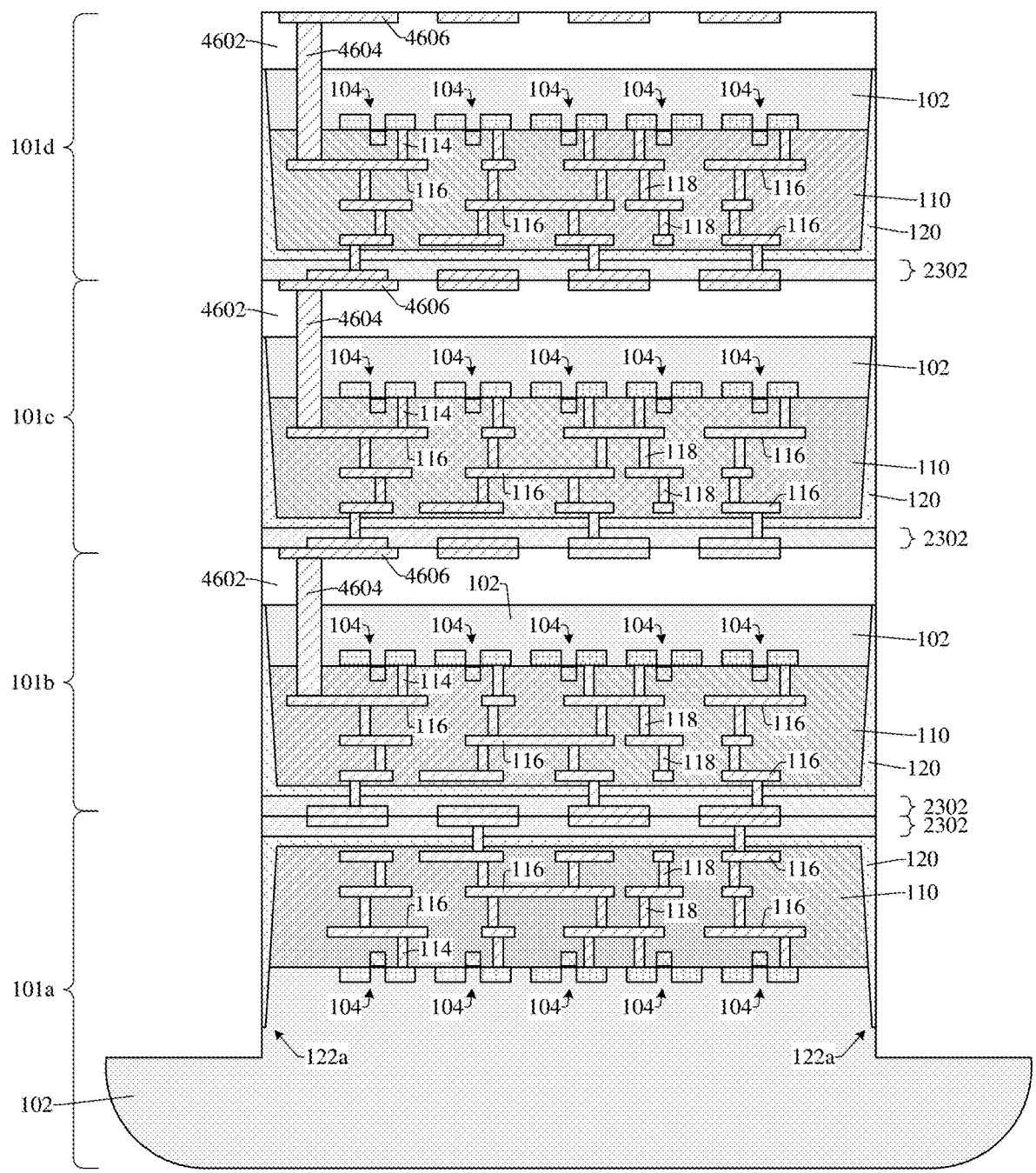

As shown in cross-sectional view 5100 of FIG. 51, the fourth wafer structure 101d is grinded; the first, second, third, and fourth wafer structures 101a, 101b, 101c, 101d are trimmed along a first protrusion (not labeled) of the seal ring layer 120; a backside dielectric layer 4602 is formed along a backside of the fourth wafer structure 101d; a TSV 4604 is formed within the substrate 102 of the fourth wafer structure 101d and within the backside dielectric layer 4602 of the fourth wafer structure 101d; and bond pads 4606 are formed along a top surface of the backside dielectric layer 4602 of the fourth wafer structure 101d.

Thus, the present disclosure relates to a semiconductor wafer structure and a method for forming the semiconductor wafer structure, the semiconductor wafer structure including a seal ring layer surrounding a sidewall of a dielectric stack to prevent damage from occurring along the sidewall of the dielectric stack during wafer trimming and/or during subsequent wafer processing.

Accordingly, in some embodiments, the present disclosure relates to a semiconductor wafer structure including a semiconductor substrate and a plurality of semiconductor devices disposed along the semiconductor substrate. A dielectric stack including a plurality of dielectric layers is arranged over the semiconductor substrate. A conductive interconnect structure is within the dielectric stack. A seal ring layer is over the dielectric stack and laterally surrounds the dielectric stack along a first sidewall of the dielectric stack. The seal ring layer includes a first protrusion that extends into a first trench in the semiconductor substrate. In some embodiments, the seal ring layer continuously extends along a top surface of the dielectric stack, along the first sidewall of the dielectric stack, and along a sidewall of the semiconductor substrate that surrounds a center of the semiconductor substrate and that is disposed below a bottom surface of the dielectric stack. In some embodiments, a first pair of sidewalls of the semiconductor substrate delimit the first trench in the semiconductor substrate, and the first protrusion extends below a bottom surface of the dielectric stack and surrounds a center of the semiconductor substrate in a first closed path. In some embodiments, the first protrusion is directly between the first pair of sidewalls that delimit the first trench and extends along the first trench in the first closed path. In some embodiments, a bottom of the first trench is delimited by an upper surface of the semiconductor substrate, and a bottom surface of the first protrusion is on the upper surface of the semiconductor substrate. In some embodiments, the first pair of sidewalls of the semiconductor substrate are tapered, and the seal ring layer is directly over the first pair of sidewalls. In some embodiments, a bottom of the first trench is delimited by an edge at which the first pair of sidewalls meet, the seal ring layer is directly over the edge, and sidewalls of the first protrusion meet along the edge. In some embodiments, a second pair of sidewalls of the semiconductor substrate delimit a second trench in the semiconductor substrate that surrounds the first trench in a second closed path, the seal ring layer includes a second protrusion that extends into the second trench directly between the second pair of sidewalls, and the second protrusion extends along the second trench in the second closed path. In some embodiments, the first trench is delimited by a first pair of sidewalls of the semiconductor substrate, the first sidewall of the dielectric stack, and a second sidewall of the dielectric stack that faces the first sidewall of the dielectric stack, and the first protrusion extends directly between the first and second sidewalls of the dielectric stack and directly between the first pair of sidewalls of the semiconductor substrate.

In other embodiments, the present disclosure relates to a method for forming a semiconductor wafer structure. The method includes forming a plurality of semiconductor devices along a semiconductor substrate. A dielectric layer is deposited over the semiconductor substrate. Conductive interconnect wires are formed within the dielectric layer. A first trench is formed in the semiconductor substrate. The first trench surrounds a center of the semiconductor substrate along a perimeter of the semiconductor substrate. A first portion of a seal ring layer including a dielectric is deposited, with a first deposition process, directly over the dielectric layer, in the first trench, and along a sidewall of the dielectric layer that delimits a perimeter of the dielectric layer. A top surface of the seal ring layer is planarized. In some embodiments, forming the first trench includes removing portions of the dielectric layer and the semiconductor substrate in a closed path along the perimeter of the semiconductor substrate. In some embodiments, the seal ring layer remains directly over the dielectric layer after the planarizing of the top surface of the seal ring layer. In some embodiments, the method further includes depositing, with a second deposition process, a second portion of the seal ring layer over the first portion and between the first trench and an outermost edge of the semiconductor substrate. In some embodiments, depositing the first portion of the seal ring layer in the first trench forms a first protrusion of the seal ring layer in the first trench. In some embodiments, the method further includes forming a second trench in the semiconductor substrate. The second trench surrounds the first trench. The method further includes depositing, with the first deposition process, the seal ring layer in the second trench, thereby forming a second protrusion of the seal ring layer in the second trench. The semiconductor substrate is directly between the first protrusion and the second protrusion. In some embodiments, the method further includes trimming the semiconductor substrate along an outermost edge of the semiconductor substrate. The trimming removes a portion of the first protrusion. The first protrusion remains along the sidewall of the dielectric layer after the trimming.

In yet other embodiments, the present disclosure relates to a method for forming a semiconductor wafer structure. The method includes forming a plurality of semiconductor devices along a semiconductor substrate. A plurality of dielectric layers are deposited over the semiconductor substrate to form a dielectric stack. A plurality of conductive interconnect wires are formed within the dielectric stack. A portion of the semiconductor substrate is removed to form a first trench in the semiconductor substrate. the first trench is delimited by sidewalls of the substrate and surrounds a center of the semiconductor substrate in a first closed path. A dielectric is deposited over the dielectric stack and in the first trench to form a seal ring layer having a first protrusion that fills the first trench. The first protrusion surrounds the center of the semiconductor substrate in the first closed path. The seal ring layer surrounds a perimeter of the dielectric stack in a second closed path. In some embodiments, the method further includes removing a first portion of the seal ring layer from directly over the dielectric stack, where a second portion of the seal ring layer remains directly over the dielectric stack after the first portion is removed. In some embodiments, the method further includes forming a protective layer over the dielectric stack and over the semiconductor substrate before forming the first trench, where the removing of the portion of the semiconductor substrate to form the first trench includes cutting through the protective layer and into the semiconductor substrate using a laser beam. In some embodiments, the semiconductor substrate, the plurality of semiconductor devices, the dielectric stack, the plurality of conductive interconnect wires, and the seal ring layer form a first wafer structure. The method further includes bonding a second wafer structure to the first wafer structure, grinding the second wafer structure to reduce a thickness of the second wafer structure, and trimming the first and second wafer structures along an outermost edge of the semiconductor substrate. The trimming removes an outer portion of the first protrusion, and an inner portion of the first protrusion remains surrounding the perimeter of the dielectric stack after the trimming.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer structure, comprising:
   a semiconductor substrate comprising a first semiconductor;
   a plurality of semiconductor devices disposed along the semiconductor substrate;
   a dielectric stack comprising a plurality of dielectric layers arranged over the semiconductor substrate;
   a conductive interconnect structure within the dielectric stack; and
   a seal ring layer over the dielectric stack and laterally surrounding the dielectric stack along a first sidewall of the dielectric stack, the seal ring layer comprising a first protrusion that extends into a first trench in the first semiconductor of the semiconductor substrate.

2. The semiconductor wafer structure of claim 1, wherein the seal ring layer continuously extends along a top surface of the dielectric stack, along the first sidewall of the dielectric stack, and along a sidewall of the first semiconductor that surrounds a center of the first semiconductor and that is disposed below a bottom surface of the dielectric stack.

3. The semiconductor wafer structure of claim 1, wherein a first pair of sidewalls of the first semiconductor delimit the first trench in the first semiconductor, and wherein the first protrusion extends below a bottom surface of the dielectric stack and surrounds a center of the first semiconductor in a first closed path.

4. The semiconductor wafer structure of claim 3, wherein the first protrusion is directly between the first pair of sidewalls that delimit the first trench and extends along the first trench in the first closed path.

5. The semiconductor wafer structure of claim 4, wherein a bottom of the first trench is delimited by an upper surface of the first semiconductor, and wherein a bottom surface of the first protrusion is on the upper surface of the first semiconductor.

6. The semiconductor wafer structure of claim 4, wherein the first pair of sidewalls of the first semiconductor are tapered, and wherein the seal ring layer is directly over the first pair of sidewalls.

7. The semiconductor wafer structure of claim 6, wherein a bottom of the first trench is delimited by an edge at which the first pair of sidewalls meet, wherein the seal ring layer is directly over the edge, and wherein sidewalls of the first protrusion meet along the edge.

8. The semiconductor wafer structure of claim 4, wherein a second pair of sidewalls of the first semiconductor delimit a second trench in the first semiconductor of the semiconductor substrate that surrounds the first trench in a second closed path, wherein the seal ring layer comprises a second protrusion that extends into the second trench directly between the second pair of sidewalls, and wherein the second protrusion extends along the second trench in the second closed path.

9. The semiconductor wafer structure of claim 1, wherein the first trench is delimited by a first pair of sidewalls of the semiconductor substrate, the first sidewall of the dielectric stack, and a second sidewall of the dielectric stack that faces the first sidewall of the dielectric stack, and wherein the first protrusion extends directly between the first and second sidewalls of the dielectric stack and directly between the first pair of sidewalls of the semiconductor substrate.

10. A method for forming a semiconductor wafer structure, the method comprising:
    forming a plurality of semiconductor devices along a semiconductor substrate, the semiconductor substrate comprising a first semiconductor;
    depositing a dielectric layer over the semiconductor substrate;
    forming conductive interconnect wires within the dielectric layer;
    forming a first trench in the first semiconductor of the semiconductor substrate, the first trench surrounding a center of the semiconductor substrate along a perimeter of the semiconductor substrate;
    depositing, with a first deposition process, a first portion of a seal ring layer comprising a dielectric directly over the dielectric layer, in the first trench, and along a sidewall of the dielectric layer that delimits a perimeter of the dielectric layer; and
    planarizing a top surface of the seal ring layer.

11. The method of claim 10, wherein forming the first trench comprises removing portions of the dielectric layer and the first semiconductor in a closed path along the perimeter of the first semiconductor.

12. The method of claim 11, wherein the seal ring layer remains directly over the dielectric layer after the planarizing of the top surface of the seal ring layer.

13. The method of claim 10, further comprising:
depositing, with a second deposition process, a second portion of the seal ring layer over the first portion and between the first trench and an outermost edge of the first semiconductor.

14. The method of claim 10, wherein depositing the first portion of the seal ring layer in the first trench forms a first protrusion of the seal ring layer in the first trench.

15. The method of claim 14, further comprising:
forming a second trench in the first semiconductor of the semiconductor substrate, the second trench surrounding the first trench; and
depositing, with the first deposition process, the seal ring layer in the second trench, thereby forming a second protrusion of the seal ring layer in the second trench, wherein the first semiconductor is directly between the first protrusion and the second protrusion.

16. The method of claim 14, further comprising:
trimming the semiconductor substrate along an outermost edge of the semiconductor substrate, wherein the trimming removes a portion of the first protrusion, and wherein the first protrusion remains along the sidewall of the dielectric layer after the trimming.

17. A method for forming a semiconductor wafer structure, the method comprising:
forming a plurality of semiconductor devices along a semiconductor substrate, the semiconductor substrate comprising a first semiconductor;
depositing a plurality of dielectric layers over the first semiconductor to form a dielectric stack;
forming a plurality of conductive interconnect wires within the dielectric stack;
removing a portion of the first semiconductor to form a first trench in the first semiconductor, wherein the first trench is delimited by sidewalls of the first semiconductor and surrounds a center of the first semiconductor-substrate in a first closed path; and
depositing a dielectric over the dielectric stack and in the first trench to form a dielectric seal ring layer having a first dielectric protrusion that fills the first trench, wherein the first dielectric protrusion surrounds the center of the first semiconductor in the first closed path, and wherein the dielectric seal ring layer surrounds a perimeter of the dielectric stack in a second closed path.

18. The method of claim 17, further comprising:
removing a first portion of the dielectric seal ring layer from directly over the dielectric stack, wherein a second portion of the dielectric seal ring layer remains directly over the dielectric stack after the first portion is removed.

19. The method of claim 17, further comprising:
forming a protective layer over the dielectric stack and over the semiconductor substrate before forming the first trench, wherein the removing of the portion of the first semiconductor to form the first trench comprises cutting through the protective layer and into the first semiconductor using a laser beam.

20. The method of claim 17, wherein the semiconductor substrate, the plurality of semiconductor devices, the dielectric stack, the plurality of conductive interconnect wires, and the dielectric seal ring layer form a first wafer structure, and wherein the method further comprises:
bonding a second wafer structure to the first wafer structure;
grinding the second wafer structure to reduce a thickness of the second wafer structure; and
trimming the first and second wafer structures along an outermost edge of the semiconductor substrate, wherein the trimming removes an outer portion of the first dielectric protrusion, and wherein an inner portion of the first dielectric protrusion remains surrounding the perimeter of the dielectric stack after the trimming.

* * * * *